US007501347B2

(12) United States Patent
Noguchi et al.

(10) Patent No.: US 7,501,347 B2
(45) Date of Patent: Mar. 10, 2009

(54) SEMICONDUCTOR DEVICE AND MANUFACTURING METHOD OF THE SAME

(75) Inventors: Junji Noguchi, Fussa (JP); Takashi Matsumoto, Hamura (JP); Takayuki Oshima, Ome (JP); Toshihiko Onozuka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/446,137

(22) Filed: Jun. 5, 2006

(65) Prior Publication Data
US 2006/0281298 A1 Dec. 14, 2006

(30) Foreign Application Priority Data
Jun. 8, 2005 (JP) .............................. 2005-167676

(51) Int. Cl.
*H01L 21/311* (2006.01)
(52) U.S. Cl. ...................................... 438/700; 438/702
(58) Field of Classification Search ................. 257/774, 257/758; 438/619, 637, 667, 421, 700, 702, 438/692
See application file for complete search history.

(56) References Cited

U.S. PATENT DOCUMENTS

| 5,949,143 | A * | 9/1999 | Bang ........................... 257/758 |
| 6,281,585 | B1 * | 8/2001 | Bothra ........................ 257/758 |
| 6,297,554 | B1 * | 10/2001 | Lin .............................. 257/752 |
| 6,406,992 | B1 * | 6/2002 | Mao et al. .................... 438/622 |
| 6,764,950 | B2 * | 7/2004 | Noguchi et al. ............. 438/687 |
| 6,800,513 | B2 * | 10/2004 | Horiuchi et al. ............. 438/157 |
| 6,875,686 | B2 * | 4/2005 | Demolliens et al. ......... 438/622 |
| 6,890,846 | B2 * | 5/2005 | Noguchi ..................... 438/622 |
| 2003/0183940 | A1 * | 10/2003 | Noguchi et al. ............. 257/767 |
| 2006/0088975 | A1 | 4/2006 | Ueda |

FOREIGN PATENT DOCUMENTS

| JP | 2001-085519 | 8/2000 |
| JP | 2003-297918 | 3/2002 |
| JP | 2005-136152 | 10/2003 |

* cited by examiner

*Primary Examiner*—N Drew Richards
*Assistant Examiner*—Swapneel Chhaya
(74) *Attorney, Agent, or Firm*—Reed Smith LLP; Juan Carlos A. Marquez, Esq.

(57) ABSTRACT

In a semiconductor device, capacitance between copper interconnections is decreased and the insulation breakdown is improved simultaneously, and a countermeasure is taken for misalignment via by a manufacturing method including the steps of forming an interconnection containing copper as a main ingredient in an insulative film above a substrate, forming insulative films and a barrier insulative film for a reservoir pattern, forming an insulative film capable of suppressing or preventing copper from diffusing on the upper surface and on the lateral surface of the interconnection and above the insulative film and the insulative film, forming insulative films of low dielectric constant, in which the insulative film is formed such that the deposition rate above the opposing lateral surfaces of the interconnections is larger than the deposition rate therebelow to form an air gap between the adjacent interconnections and, finally, planarizing the insulative film by interlayer CMP.

11 Claims, 32 Drawing Sheets

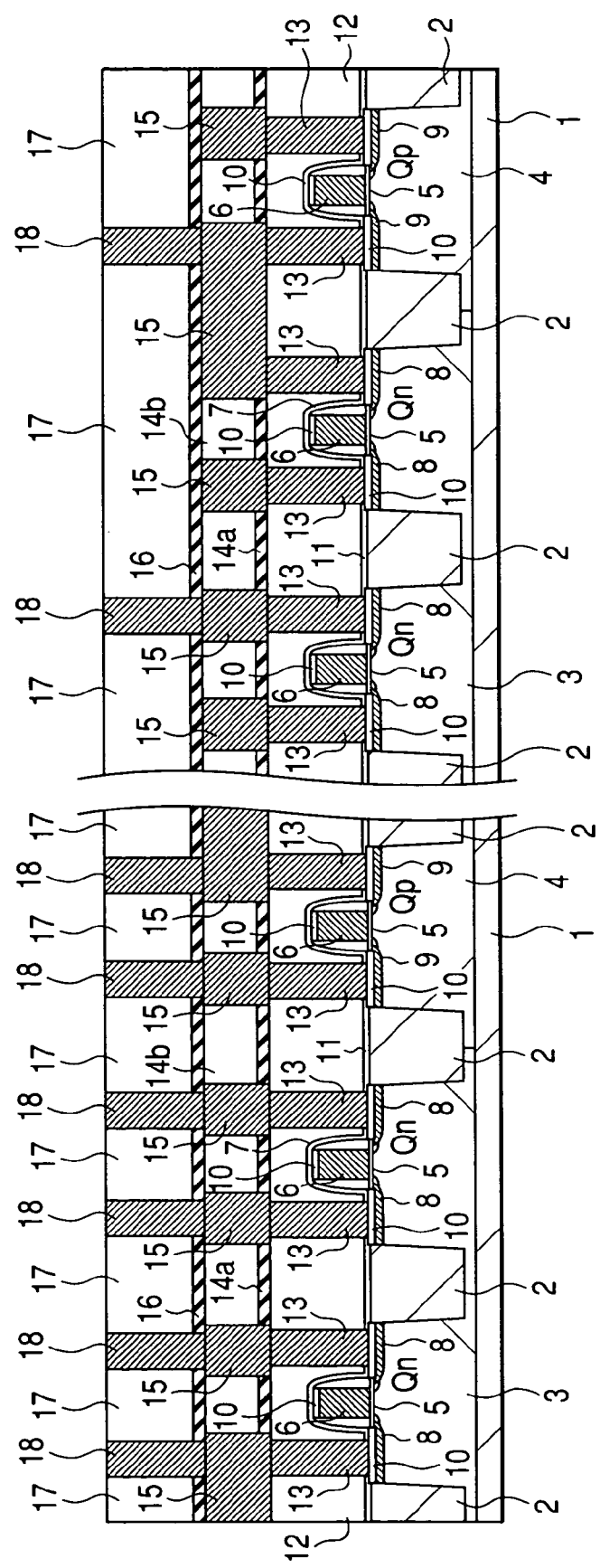

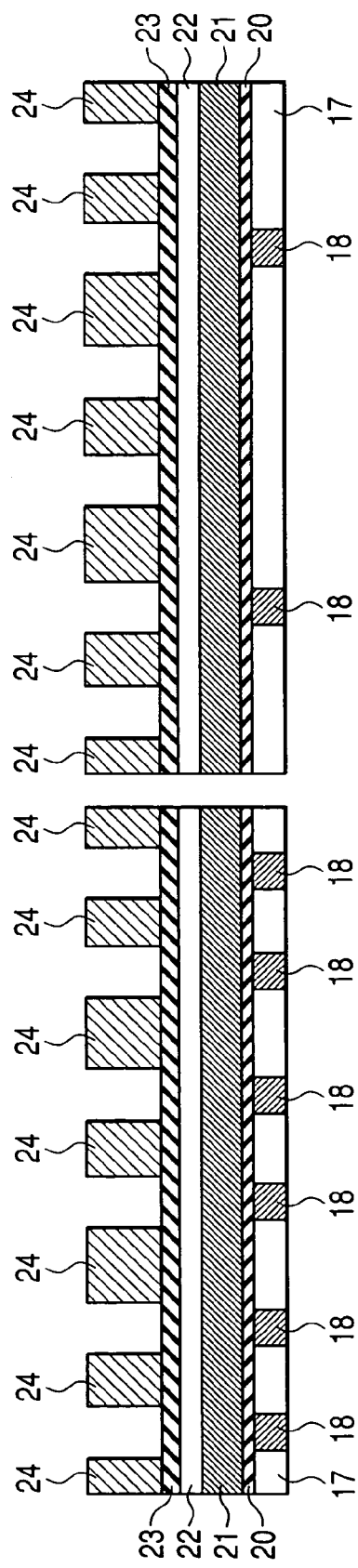
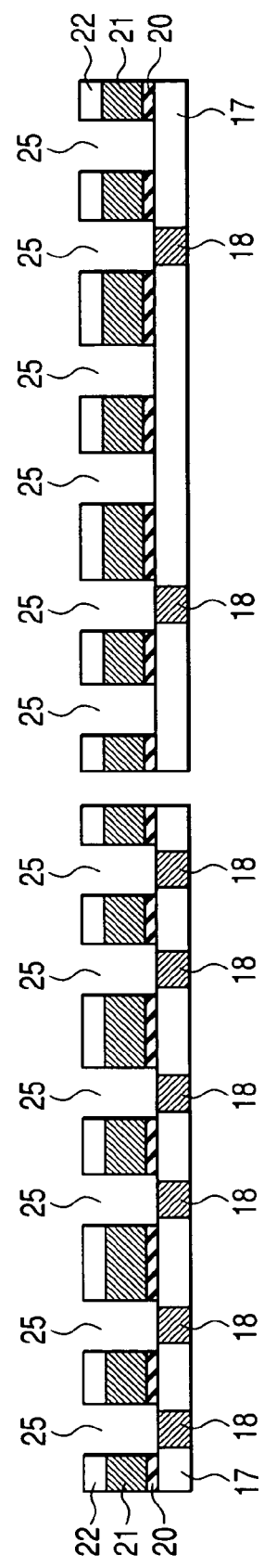

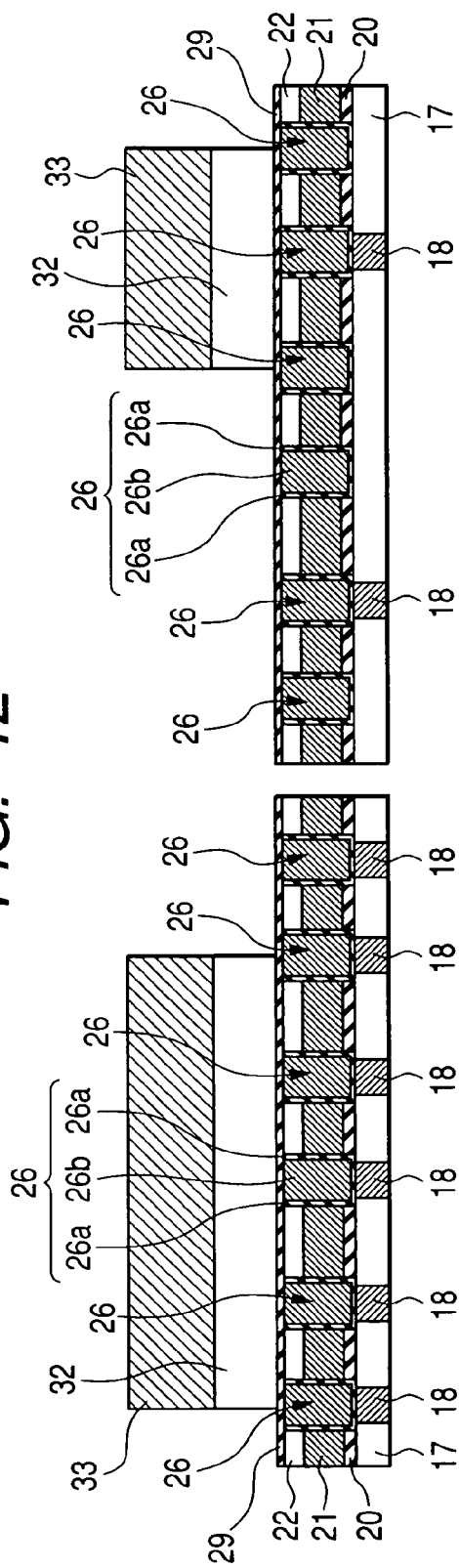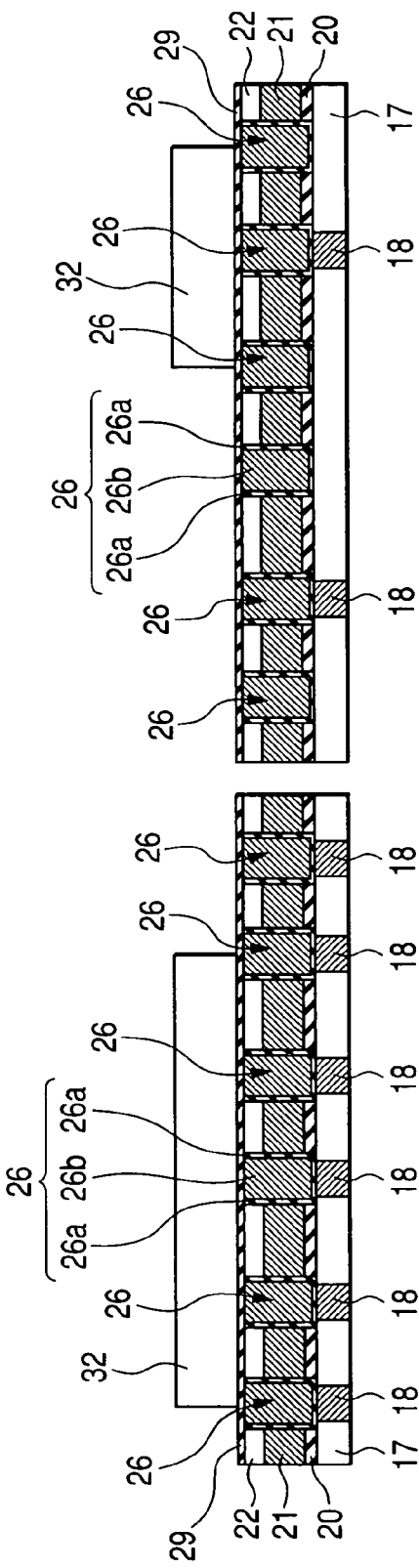

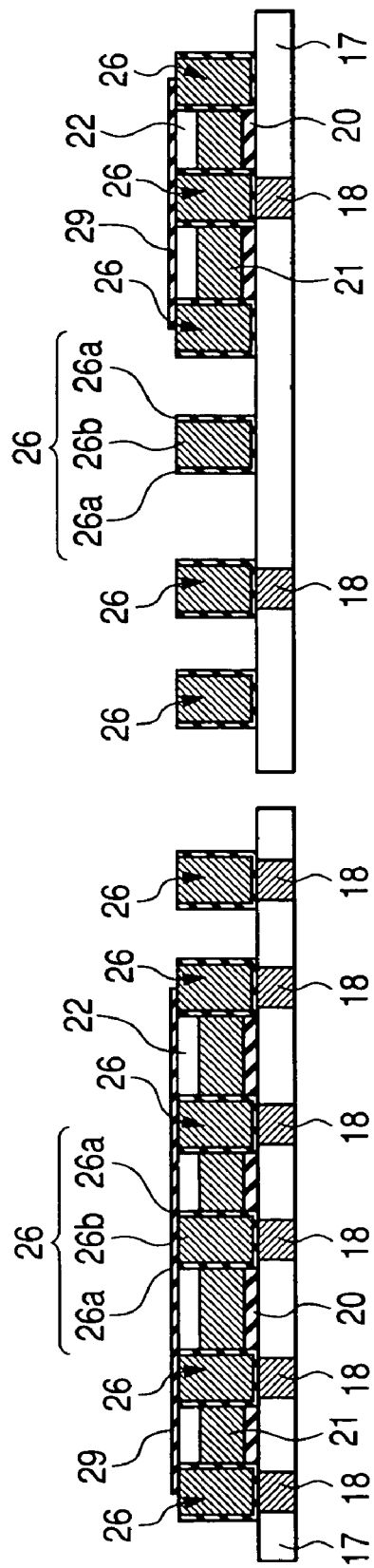
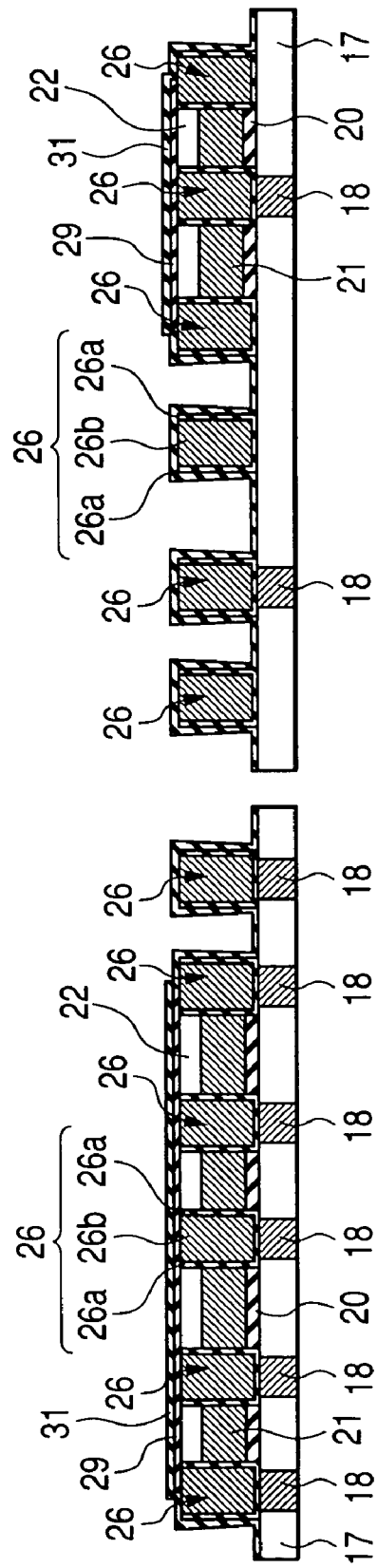
FIG. 14
FIG. 15

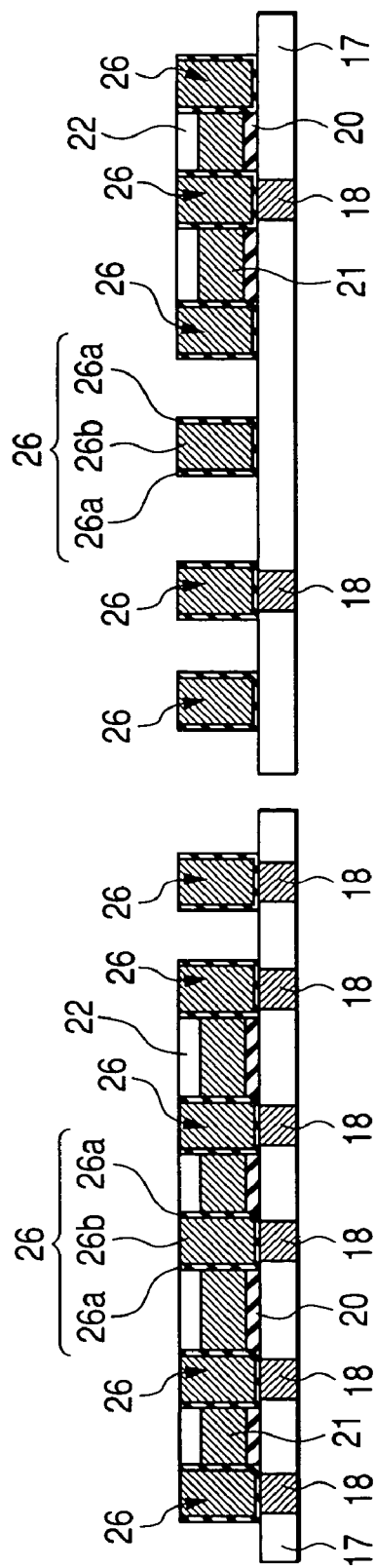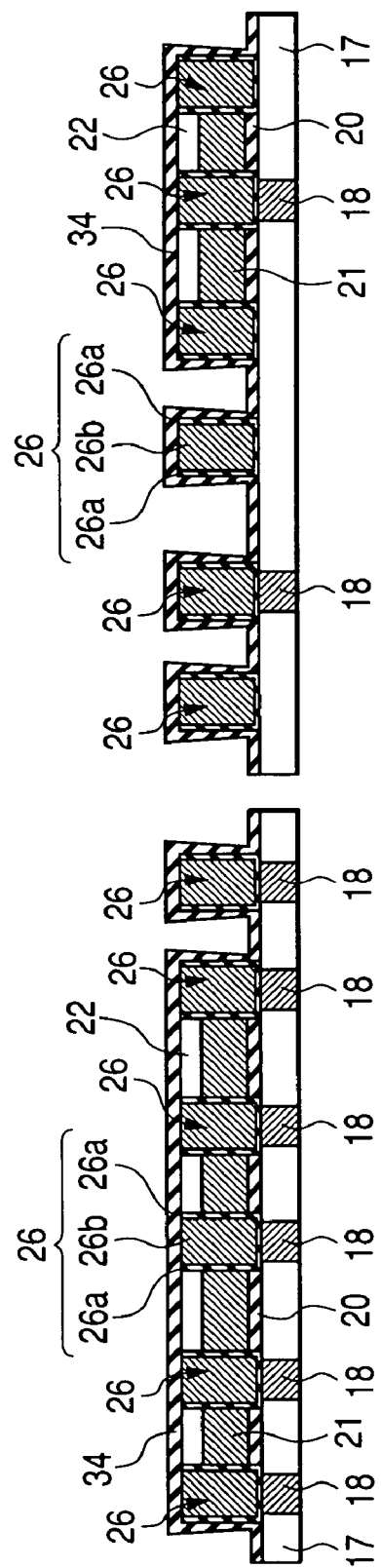

SEMICONDUCTOR DEVICE AND MANUFACTURING METHOD OF THE SAME

CLAIM OF PRIORITY

The present application claims priority from Japanese application JP 2005-167676 filed on Jun. 8, 2005, the content of which is hereby incorporated by reference into this application.

FIELD OF THE INVENTION

The present invention concerns a semiconductor device and a manufacturing technique thereof and, particularly, it relates to a technique effective for application to a semiconductor device having an interconnection containing a main conductor film comprising copper as a main ingredient.

BACKGROUND OF THE INVENTION

A buried interconnection structure is formed by burying an interconnection material in an interconnection opening such as an interconnection trench or hole formed in an insulative film by an interconnection forming technique referred to as a damascene technique (single-damascene) technique and a dual damascene technique. However, in a case of using copper (Cu) as a main material for the interconnection, since copper tends to be diffused more in an insulative film compared with a metal such as aluminum (Al), the surface (bottom and lateral side) of the buried interconnection is covered with a thin barrier metal film such that the buried interconnection comprising copper is not in direct contact with the insulative film thereby suppressing or preventing copper in the buried interconnection from diffusing into the insulative film. Further, a barrier insulative film for an interconnection cap comprising, for example, a silicon nitride film is formed on the upper surface of an insulative film formed with the interconnection opening to cover the upper surface of the buried interconnection thereby suppressing or preventing the copper in the buried interconnection from diffusing from the upper surface of the buried interconnection into the insulative film.

In these recent years, the distance between the buried interconnections has been decreased along with increase in the integration degree of semiconductor devices. This increases a parasitic capacitance between the interconnections to cause signal delay and generate cross-talk between the adjacent interconnections. Accordingly it is desirable to decrease the parasitic capacitance between interconnections. Materials of low dielectric constant are used for the insulative film between interconnections. Further, JP-A No. 2001-85519 discloses a technique of forming an inter-layer insulative film such that the interconnection is formed in an inverted tapered shape and an air gap is formed in the space between the interconnections. The capacitance between the interconnections is intended to be decreased by the air gap. In addition, JP-A No. 2003-297918 discloses a technique of forming an air gap between interconnections.

SUMMARY OF THE INVENTION

By the way, according to the result of the study made by the present inventor, it has been found that the buried interconnection technique using the copper as a main conductor layer involves the following problems.

Use of copper for the interconnection material involves a problem that a TDDB (Time Dependence on Dielectric Breakdown) life is extremely shorter than that of other metal materials (for example, aluminum and tungsten). In addition, while an insulative material of lower dielectric constant than that of silicon oxide has tended to be used as an insulative film between the interconnections with a view point that the interconnection pitch has become finer and the effective electric field intensity tends to be increased and in view of decrease in the interconnection capacitance in recent years, since the insulative film of low dielectric constant generally has low insulative dielectric breakdown voltage, securement for TDDB life has become difficult more and more.

It is generally considered that degradation of the TDDB life is attributable to that copper applied to the interconnection material diffuses in the periphery, to lower the dielectric breakdown voltage between the interconnections. For example, JP-A No. 2001-85519 has no consideration at all for the barrier metal film and the barrier insulative film. Accordingly, even when the capacitance between the interconnections is decreased by the air gap of the inter-layer insulative film, copper used as the interconnection material diffuses in the inter-layer insulative film to deteriorate the TDDB life. Further, since the air gap is formed by inversely tapering the interconnection, electric fields are concentrated to the upper end of the interconnection to further deteriorate the TDDB life. Further, JP-A No. 2001-85519 does not disclose at all the formation of a via hole to be connected with the interconnection.

JP-A No. 2003-297918 discloses a technique as a countermeasure to the degradation of the TDDB life. However, countermeasure for the misaligned via hole is not taken into consideration at all in JP-A No. 2003-297918 and this results in a problem that misalignment with the interconnection occurs at the through hole position for forming the via hole by an exposure apparatus in a lithographic process and, in a case where an air gap is present below the through hole, a cleaning solution or Cu plating solution penetrates subsequently to result in failure of electric connection or increase of the capacitance.

The present invention intends to provide a semiconductor device capable of improving the dielectric breakdown voltage between interconnections using copper as a main conductor layer, as well as a manufacturing method thereof.

The invention further intends to provide a semiconductor device capable of decreasing the capacitance between interconnections using copper for the main conductor layer as a countermeasure for misalignment via hole, as well as a manufacturing method thereof.

The foregoing and other objects and the noble features of the invention will become apparent by reading the following description of the specification in conjunction with the appended drawings.

Among the inventions disclosed in the present application, the outlines of typical inventions are to be briefly explained as below.

A method of manufacturing a semiconductor device according to the invention includes the following steps of:

(a) forming a plurality of interconnection trenches in a first insulative film above a semiconductor substrate, (b) forming a first conductor film above the first insulative film including the inside of each of the plurality of the interconnection trenches, (c) removing the first conductor film at the outside of the plurality of the interconnection trenches, thereby forming an interconnection comprising the first conductor film in the inside of each of the plurality of the interconnection trenches, (d) leaving the first insulating film in the lower region of a through hole that exposes the upper-surface of the interconnection formed in the subsequent step and the peripheral region thereof, and removing the first insulative film from portions other than each of the regions described above, (e) forming a second insulative film above the interconnection while leaving an air gap in a space region between the interconnection from which the first insulative film has been removed, (f) forming a through hole penetrating the second insulative film above the interconnection, and (g) forming a second conductor film in the inside of the through hole.

A method of manufacturing a semiconductor device according to the invention includes the following steps of:

(a) forming a plurality of interconnection trenches in a first insulative film above a semiconductor substrate, (b) forming a first conductor film above the first insulative film including the inside of each of the plurality of the interconnection trenches, (c) removing the first conductor film at the outside of the plurality of the interconnection trenches by a CMP method, thereby forming an interconnection comprising the first conductor film to the inside of each of the plurality of the interconnection trenches, (d) forming a first barrier insulative film above the first insulative film and the plurality of the interconnections, (e) leaving the first barrier insulative film and the first insulative film in the lower region of a through hole that expose the upper surface of the interconnection to be formed in the subsequent step and a peripheral region thereof, and removing the first barrier insulative film and the first insulative film from portions other than each of the regions described above, (f) forming a second barrier insulative film above the first barrier insulative film and above the lateral surface and the upper surface of the interconnection, (g) forming a second insulative film above the second barrier insulative film while leaving an air gap in the space region between the interconnections from which the first barrier insulative film and the first insulative film have been removed, (h) forming a through hole penetrating the first barrier insulative film, the second barrier insulative film, and the second insulative film above the interconnection, and (i) forming a second conductor film in the inside of the through hole.

A method of the manufacturing a semiconductor device according to the invention includes the following steps of:

(a) forming a first conductor film above a semiconductor substrate, (b) selectively removing the first conductor film by a dry etching method using a photoresist pattern as a mask thereby forming a plurality of first interconnections, (c) forming a first insulative film above the interconnection and in a space region between the interconnections, (d) leaving the first insulative film in the lower region of a through hole that exposes the upper surface of the interconnection to be formed by the subsequent step and the peripheral region thereof, and removing the first insulative film from the portions other than each of the regions described above, (e) forming a second insulative film above the interconnection while leaving an air gap in a space region between the interconnections from which the first insulative film has been removed, (f) forming a through hole penetrating the first insulative film and the second insulative film above the interconnection, and (g) forming a second conductor film in the inside of the through hole.

The effects obtained by typical inventions among those disclosed in the present application are briefly explained as below.

The dielectric breakdown between interconnections can be improved, and capacitance between the interconnections can be decreased while taking a countermeasure for misalignment via hole.

BRIEF DESCRIPTION OF THE DRAWINGS

FIG. 3 is a cross sectional view along line A-A in FIG. 2;

FIG. 4 is a cross sectional view for a main portion in the manufacturing step of a semiconductor device succeeding to FIG. 3;

FIG. 5 is a cross sectional view for a main portion in the manufacturing step of a semiconductor device succeeding to FIG. 4;

FIG. 12 is a cross sectional view for a main portion in the manufacturing step of a semiconductor device succeeding to FIG. 11;

FIG. 13 is a cross sectional view for a main portion in the manufacturing step of a semiconductor device succeeding to FIG. 12;

FIG. 14 is a cross sectional view for a main portion in the manufacturing step of a semiconductor device succeeding to FIG. 13;

FIG. 15 is a cross sectional view for a main portion in the manufacturing step of a semiconductor device succeeding to FIG. 14;

FIG. 16 is a cross sectional view for a main portion in the manufacturing step of a semiconductor device in another embodiment of the invention succeeding to FIG. 13;

FIG. 17 is a cross sectional view for a main portion in the manufacturing step of a semiconductor device succeeding to FIG. 16;

DESCRIPTION OF THE PREFERRED EMBODIMENTS

Figure 1:
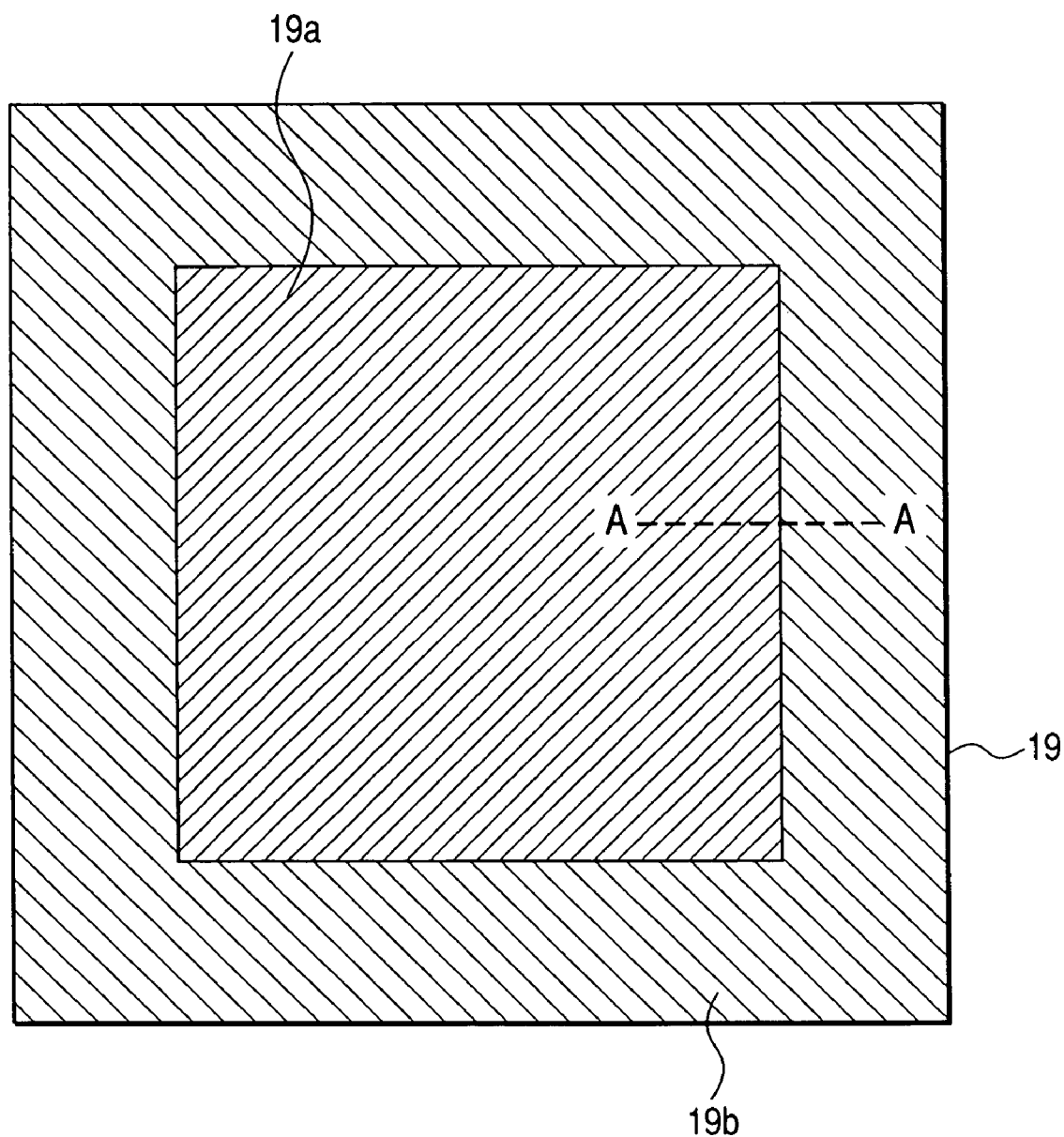
FIG. 1 is a plane view for the layout of a semiconductor device according to an embodiment of the present invention.

Preferred embodiments of the present invention are to be described specifically with reference to the drawings. Throughout the drawings for explaining the preferred embodiments, members having identical functions carry identical reference numerals and duplicate descriptions of the members are to be omitted. Further, in the following embodiments, descriptions are not repeated, in principle, for identical or similar portions unless this is particularly required.

Embodiment 1

At first, the cause for the degradation of the TDDB life between a buried interconnection using the copper as the main conductor layer described above by the present inventors is to be explained. The TDDB (Time Dependence on Dielectric Breakdown) life is a measure for objectively determining the time dependence of dielectric breakdown, which is a time (life) obtained by applying a relatively high voltage between electrodes under a measuring condition at a predetermined temperature (for example, 140° C.), preparing a graph by plotting a time from voltage application to dielectric breakdown relative to the applied electric field and extrapolating to an electric field intensity actually used (for example, 0.2 MV/cm) in view of the graph.

Degradation of the TDDB life is generally considered to be attributable to that copper applied to the interconnection material diffuses to the periphery, and lowers the dielectric breakdown voltage between interconnections. However, according to the result of the investigation made by the present inventors, the following factors are predominant for the copper diffusion phenomenon. At first, for the diffusion of copper in the insulative film between adjacent interconnections, the factor that ionized copper supplied from copper oxide (CuO) or copper silicide, rather than atomic copper, drifts and diffuses at a potential between the interconnections is predominant. Secondly, as the copper diffusion path, the boundary between the insulative film to which the copper interconnection is formed and the interconnection cap film (barrier insulative film) is predominant. Then, it has been found from them that the degradation of the TDDB life is due to the following mechanism.

That is, on the surface of the buried interconnection using copper as a main conductor film, copper oxide (CuO) is formed by the surface process after CMP, or copper silicide ($CuSi_x$) is formed upon formation of a cap film (silicon nitride film). Such copper oxide or copper silicide is more tended to be ionized compared with pure copper. Thus, ionized copper is drifted by an electric field between interconnections and diffused in the insulative film between the interconnections. On the other hand, a lot of CMP damages, organic materials, or dangling bonds are present at the boundary between the insulative film (silicon oxide film) forming the buried interconnection and the cap film (silicon nitride film) and the boundary is discontinuous and also poor in adhesion. Presence of such dangling bonds has an effect of promoting the diffusion of copper ions and the copper ions are drifted and diffused along the boundary. That is, a leak path is formed to the boundary between the interconnections. The leak current flowing through the leak path, being also combined with thermal stress due to the leak effect and the current for long time and, subsequently, the current value increases acceleratively to reach dielectric breakdown (lowering of TDDB life).

Then, in this embodiment, it has been studied to eliminate the CMP surface (surface polished by CMP) as the boundary that acts as the leak path between the interconnections of an identical layer to improve the TDDB characteristics. Further, a countermeasure is taken for misaligned via hole and reduction of the parasitic capacitance between the interconnections has also been studied.

A semiconductor device of a preferred embodiment and a manufacturing step thereof are to be described with reference to the drawings. FIG. 1 is a plane view for a layout of an integrated circuit chip 9 as a preferred embodiment of the present invention. A general integrated circuit includes a dense pattern portion 19a containing RAM (Random Access Memory), etc. and a thin pattern portion 19b containing peripheral circuits, etc. In the dense pattern portion 19a, interconnection patterns and contacts, through holes are present densely. On the other hand, in the thin pattern portion 19b, a space between interconnections has a margin to some extent, and the number of through holes to be connected is smaller compared with that in the dense pattern portion 19a.

Figure 2:
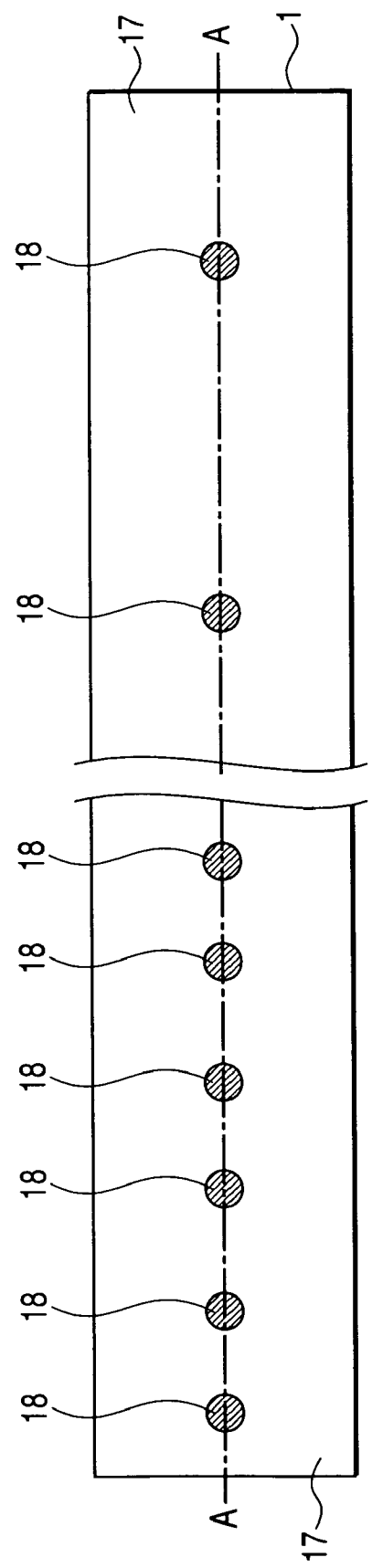
FIG. 2 is a plane view for a main portion along line A-A in FIG. 1 in the manufacturing step of a semiconductor device according to an embodiment of the present invention.

FIG. 2 is a plane view for a main portion in the manufacturing step of a semiconductor device, for example, CMISFET (Complementary Metal Insulator Semiconductor Field Effect Transistor) as a preferred embodiment of the invention, which is a plane view extracted for A-A in FIG. 1. FIG. 3 is a cross sectional view along line A-A in FIG. 1.

As shown in FIG. 3, device isolation regions 2 are formed to a main surface of a wafer or a semiconductor substrate 1 comprising, for example, p-type single crystal silicon having a specific resistivity of about 1 to 10 Ω·cm. The device isolation region 2 comprises silicon oxide or the like and is formed, for example, by an STI (Shallow Trench Isolation) method or an LOCOS (Local Oxidization of Silicon) method.

In the semiconductor substrate 1, p-wells 3 and n-wells 4 are formed from the main surface thereof for a predetermined depth. The p-well 3 is formed, for example, by ion implantation of an impurity such as boron, and the n-well 4 is formed by ion implantation of an impurity such as phosphorus.

In the region of the p-well 3, an n-channel type MISFET (Qn) is formed in an active region surrounded by the device isolation region 2. Further, in the region of the n-well 4, a p-channel type MISFET (Qp) is formed in an active region surrounded by the device isolation region 2. A gate insulative film 5 of the n-type miss MISFET (Qn) and the p-type MISFET (Qp) comprises, for example, a thin silicon oxide film or silicon oxynitride film and is formed, for example, by a thermal oxidation method.

A gate electrode 6 of the n-type MISFET (Qn) and the p-type MISFET (Qp) is formed, for example, by stacking a titanium silicide ($TiSi_x$) layer or a cobalt silicide ($CoSi_x$) layer 10 on a polycrystal silicon film of low resistance. A side wall spacer or side wall 7 comprising, for example, silicon oxide is formed on the side wall of the gate electrode 6.

An n-type semiconductor region 8 which is source and drain regions of the n-type MISFET(Qn) is formed, for example, after forming the side wall 7, by ion implanting an impurity such as phosphorus on both sides of the gate electrode 6 and the side wall 7 in the p-well 3. The p-type semiconductor region 9 which is source and drain regions of the p-type MISFET(Qp) is formed, for example, after forming the side wall 7, by ion implanting an impurity such as boron on both sides of the gate electrode 6 and the side wall 7 in the n-well 4. Further, a silicide layer 10 such as a titanium silicide layer or cobalt silicide layer is formed to a portion of the upper surface of the n-type semiconductor region 8 and the p-type semiconductor region 9.

A silicon nitride film 11 is formed above the semiconductor substrate 1 so as to cover the gate electrode 6 and the side wall 7. Further, an insulative film 12 is formed of an insulative film of high reflowing property, for example, a BPSG (Boron-doped Phospho Silicate Glass) film capable of filling a narrow space between the gate electrodes 6. A contact hole 13 is formed in the insulative film 12. A portion of the main surface of the semiconductor substrate 1, for example, a portion of the n-type semiconductor region 8 and the p-type semiconductor region 9 or a portion of the gate electrode 6, etc. are exposed at the bottom of the contact hole 13.

In the contact hole 13, a conductor film, for example, made of tungsten (W) is formed. For example, it is formed by forming a titanium nitride film, then forming a tungsten film so as to fill the contact hole 13 on the titanium nitride film by a CVD (Chemical Vapor Deposition) method and removing an unnecessary tungsten film and a titanium nitride film on the insulative film 12 by a CMP (Chemical Mechanical Polishing) method or an etching back method.

Above the insulative film 12 in which the through hole 13 is buried, a first layer interconnection 15 is formed, for example, by a damascene method of manufacturing the interconnection by forming trenches in the interlayer insulative film comprising an insulative film 14a and an insulative film 14b, then filling a conductor film comprising tungsten or the like, and removing an excess conductor film by a CMP (Chemical Mechanical Polishing) method. The first layer interconnection 15 is connected electrically by way of the through hole 13 with the semiconductor regions 8 and 9 for the source and drain and the gate electrode 6 of the n-type MISFET (Qn) and the p-type MISFET (Qp). The material for the first layer interconnection 15 is not restricted to tungsten but may be changed variously. For example, it may be a single film of aluminum (Al) or aluminum alloy, or a laminate metal film in which a metal film such as of titanium (Ti) or titanium nitride (TiN) is formed to at least one of upper and lower layers of the single film.

The insulative film 14a has a role as an etching stopper film and can decrease the scattering of resistance in a case of fabricating the trench by the damascene method. As the insulative film 14a, for example, a silicon nitride ($Si_xN_y$) film, a silicon carbide (SiC) film, or a silicon carbonitride (SiCN) film may also be used. The silicon nitride film, the silicon carbide film, or the silicon carbonitride film can be formed, for example, by a plasma CVD method. The silicon carbide film formed by the plasma CVD method includes, for example, BLOk (manufactured by AMAT Co., specific dielectric constant=4.3 to 5.0). Upon formation of the film, a gas mixture, for example, of trimethyl silane and helium (or $N_2$, $NH_3$) is used.

For the insulative film 14b, a silicon oxide film, (for example, TEOS (Tetraethoxysilane) oxide film) is used. Further, for decreasing the capacitance between interconnections, the insulative film 14b comprises, for example, a low dielectric constant material such as an organic polymer or organic silica glass (so-called low-K insulative film, low-K material). The insulative film of low dielectric constant (low-K insulative film) includes, for example, an insulative film having a dielectric constant lower than the dielectric constant of a silicon oxide film (for example, TEOS (Tetraethoxysilane) oxide film) contained in a passivation film. Gradually, those having the specific dielectric constant ε of about 4.1 to 4.2 or less which is lower than that of the TEOS oxide film are referred to as insulative films of low dielectric constant.

The organic polymer as the low dielectric constant material includes, for example, SiLK (manufactured by Dow Chemical Co., in USA, specific dielectric constant=2.7, heat resistant temperature=490° C. or higher, dielectric breakdown voltage=4.0 to 5.0 MV/Vm), or FLARE as polyallyl ether (PAE) material (manufactured by Honeywell Electronic Materials, in USA, specific dielectric constant=2.8, heat resistant temperature=400° C. or higher). The PAE material has a feature of high basic performance and excellent in mechanical strength, thermal stability, and low cost. The organic silica glass as the low dielectric constant material (SiOC material) includes, for example, HSG-R7 (manufactured by Hitachi Chemical Co., Ltd., specific dielectric constant=2.8, heat resistant temperature=650° C.). Black Diamond (manufactured by Applied Materials Inc., in USA, specific dielectric constant=3.0 to 2.4, heat resistant temperature=450° C.) or p-MTES (manufactured by Hitachi development Co., specific dielectric constant=3.2). In addition, the SiOC material includes, for example, CORAL (manufactured by Novellus Systems, Inc Co., in USA, specific dielectric constant=2.7 to 2.4, heat resistant temperature=500° C.), and Aurora 2.7 (manufactured by ASM Japan K.K, specific dielectric constant=2.7, heat resistant temperature=450° C.).

Further, other low dielectric constant material for the insulative film 14b, FSG (SiOF material), HSQ (hydrogen silsesquioxane) material, MSQ (methyl silsesquioxane) material, porous HSQ material, porous MSQ material, or porous organic material can also be used for instance. The HSQ material includes, for example, OCD T-12 (manufactured by Tokyo Ohka Kogyo Co., Ltd., specific dielectric constant=3.4 to 2.9, heat resistant temperature=450° C.), FOx (manufactured by Dow Coring Corp., in USA, specific dielectric constant=2.9), or OCL T-32 (manufactured by Tokyo Ohka Kogyo Co. Ltd., specific dielectric constant 2.5, heat resistant temperature=450° C.). The MSQ material includes, for example, OCD T-9 (manufactured by Tokyo Ohka Kogyo, Co., Ltd. specific dielectric constant=2.7, heat resistant temperature=600° C.), LKD-T200 (manufactured by JSR, specific dielectric constant=2.7 to 2.5, heat resistant temperature=450° C.), HOSP (manufactured by Honeywell Electronic Materials, in USA, specific dielectric constant=2.5, heat resistant temperature=550° C.), HSG-RZ25 (manufactured by Hitachi Chemicals Co. Ltd, specific dielectric constant=2.5, heat resistant temperature=650° C.), OCL T-31 (manufactured by Tokyo Ohka Kogyo Co., Ltd., specific dielectric constant=2.3, heat resistant temperature=500° C.), or LKD T-400 (manufactured by JSR, specific dielectric constant=2.2 to 2, heat resistant temperature=450° C.).

The porous HSQ material includes, for example, XLK (manufactured by Dow Corning Corp., in USA, specific dielectric constant=2.5 to 2), OCL T-72 (manufactured by Tokyo Ohka Kogyo Co., Ltd., specific dielectric constant=2.2 to 1.9, heat resistant temperature=450° C.), Nanoglass (manufactured by Honeywell Electronic Materials, in USA, specific dielectric constant=2.2 to 1.8, heat resistant temperature=500° C. or higher), or MesoELK (manufactured by Air Products and Chemicals, Inc, in USA, specific dielectric constant=2 or less). The porous MSQ material includes, for example, HSG-6211X (manufactured by Hitachi Chemical Industry Co., Ltd. specific dielectric constant=2.4, heat resistant temperature=650° C.), ALCAP-S (manufactured by Asahi Chemical Industry Co., Ltd., specific dielectric constant=2.3 to 1.8, heat resistant temperature=450° C.), OCLT-77 (manufactured by Tokyo Ohka Kogyo Co., Ltd, specific dielectric constant=2.2 to 1.9, heat resistant temperature=600° C.), HSG-6210X (manufactured by Hitachi Chemical Co. Ltd, specific dielectric constant =2.1, heat resistant temperature=650° C.) or silica aerogel (manufactured by Kobe Steel Ltd., specific dielectric constant 1.4 to 1.1). The porous organic material includes, for example, PolyELK (manufactured by Air Products and Chemicals, Inc. USA, specific dielectric constant=2 or less, heat resistant temperature=490° C.), etc. The SiOC material, and the SiOF material are formed, for example, by a CVD method. For example, Black Diamond described above is formed, for example, by a CVD method using a gas mixture of trimethyl silane and oxygen. Further, p-MTES described above is formed, for example, by a CVD method using a gas mixture of methyl triethoxy silane and $N_2O$. Other insulative materials of low dielectric constant than described above are formed, for example, by a coating method.

In a case of using the low-K material described above, an insulative film for low-K cap is sometimes necessary over the insulative film 14b. As the insulative film for the low-K cap, for example, a silicon oxide ($SiO_x$) film typically represented by silicon dioxide ($SiO_2$) or a p-SiOC film of relatively high film strength is used. The low-K cap film has functions such as for securing mechanical strength and surface protection, and securing humidity resistance of the insulative film 14b during the CMP treatment.

Above the first layer interconnection, an inter-through hole layer structure comprising insulative films 16 and 17 is present, which can be prepared by the same method and the material as those for the insulative films 14a and 14b in the same manner as in the preparation of the first layer interconnection. In the insulative films 16 and 17, a via hole or through hole 18 in which a portion of the first layer interconnection 15 is exposed is formed. A conductor film made, for example, of tungsten is filled in the thorough hole 18.

Figure 6:
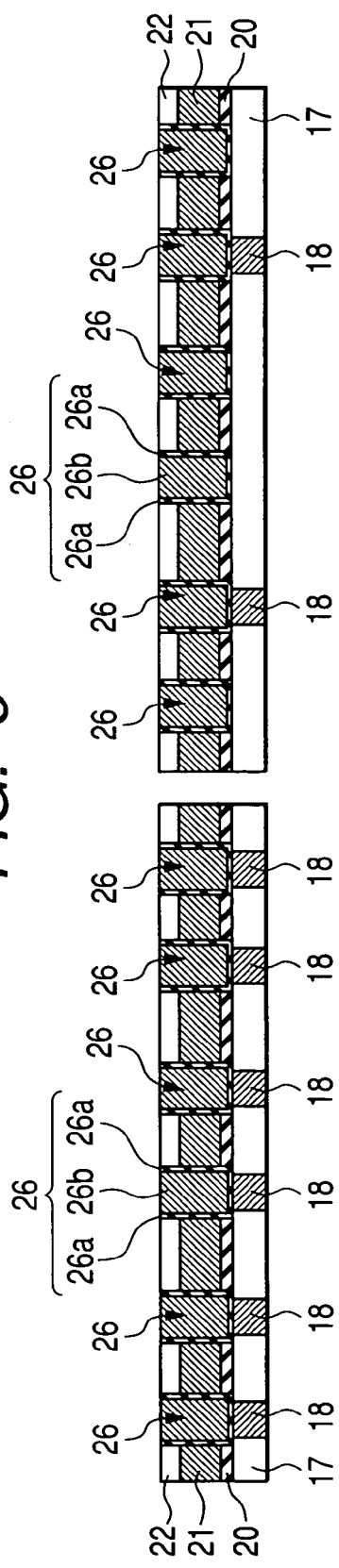
FIG. 6 is a cross sectional view for a main portion in the manufacturing step of a semiconductor device succeeding to FIG. 5.

FIG. 4 to FIG. 6 show cross sectional views for a main portion in the manufacturing step of the semiconductor device succeeding to FIG. 2. For easy understanding, those portions corresponding to the structure below the insulative film 17 in FIG. 3 are not illustrated.

At first, in this embodiment, as shown in FIG. 4, an insulative film 20 is formed over the insulative film 17 in which the through hole 18 is buried, for example, by a plasma CVD method. The insulative film 20 is formed, for example, of a silicon nitride film formed by a plasma CVD method and the thickness thereof is, for example, about from 25 nm to 50 nm. As other materials for the insulative film 20, a single film, for example, a silicon carbide film formed by a plasma CVD method, a SiCN film formed by a plasma CVD method, or a silicon oxynitride (SiON) film formed by a plasma CVD method may also be used. In the case of using the films, since the dielectric constant can be lowered remarkably compared with the silicon nitride film, the interconnection capacitance can be decreased and the operation speed of the semiconductor device can be improved. The silicon carbide film formed by the plasma CVD method includes, for example, BLOk (manufactured by AMAT Co.) described above. Further, upon forming the SiCN film, a gas mixture, for example, of helium (He), ammonia ($NH_3$) and trimethyl silane (3MS) is used. Further, the silicon oxynitride film formed by the plasma CVD method includes, for example, PE-TMS (manufactured by Canon Inc., dielectric constant=3.9) and a gas mixture, for example, of trimethoxy silane (TMS) gas and a silicon oxide ($N_2O$) gas is used upon formation thereof.

Then, an insulative film 21 is formed on the insulative film 20. For the insulative film 21, the low-K material described above, for example, the low-K insulative film such as an SiOF film or SiOC film is used. Further, as the insulative film 22 capped over the insulative film 21, a silicon oxide film or the like is used for instance. For simplifying the step, it is also possible to save the insulative film 22 and use a single silicon oxide or SiOC film for the insulative film 21.

Then, an anti-reflection film 23 and a photoresist film are formed successively above the insulative film 22, and the photoresist film is patterned by exposure to form a photoresist pattern 24. Then, the anti-reflection film 23 is removed selectively by a dry etching method using the photoresist pattern 24 as an etching photomask. Then, the insulative films 22, 21 are selectively removed by a dry etching method using the photoresist pattern 24 as an etching mask, to form an opening. Then, ashing is conducted to remove the photoresist pattern 24 and the anti-reflection film 23 by ashing and, finally, the insulative film exposed through the opening of the insulative films 22, 21 is etched. Thus, as shown in FIG. 5, an opening or interconnection trench 25 is formed. The upper surface of the plug 18 is exposed at the bottom of the interconnection trench 25. Alternatively, the insulative films 20, 21, and 22 may be removed selectively by a dry etching method using the photoresist pattern 24 as an etching mask to form an opening or interconnection trench 25 and, thereafter, the photoresist pattern 24 and the anti-reflection film 23 may be removed.

Then, as shown in FIG. 6, a thin conductive barrier film (first conductor film) 26a of about 5 to 50 nm thickness comprising, for example, titanium nitride (TiN) is formed by using, for example, a sputtering method above the entire main surface of the substrate 1. The conductive barrier film 26a has, for example, a function of preventing diffusion of copper for forming the main conductor film as will be described later and a function of improving the wettability with copper upon reflow of the main conductor film. As the material for the conductive barrier film 26a, a high melting metal nitride such as tungsten nitride (WN) or tantalum nitride (TaN) scarcely reacting with copper may also be used instead of titanium nitride. Further, as the material for the conductive barrier film 26a, a material formed by adding silicon (Si) to a high melting metal nitride, a high melting metal scarcely reacting with copper such as tantalum (Ta), titanium (Ti), tungsten (W), and a titanium tungsten (TiW) alloy, or a TaN/Ta laminate barrier in combination of TaN having good adhesion with the insulation film and Ta having good wettability with Cu may also be used.

Successively, a main conductor film comprising copper of a relatively large thickness of about 800 to 1600 nm (second conductor film) 26b is formed on the conductive barrier film 26a. The main conductor film 26b can be formed, for example, by using a CVD method, a sputtering method, or a plating method. Then, the main conductor film 26b is caused to reflow by applying a heat treatment to the substrate 1 in a non-oxidative atmosphere (for example, in hydrogen atmosphere or nitrogen atmosphere), for example, at about 150 to 400° C., thereby filling copper inside the interconnection trench 25 with no air gap.

Then, the main conductor film 26b and the conductor barrier film 26a are polished by the CMP method. Thus, as shown in FIG. 6, a second layer interconnection 26 comprising a relatively thin conductive barrier film 26a and a relatively thick main conductor film 26b is formed in the interconnection trench 25. The second layer interconnection 26 is electrically connected by way of the plug 18 with the first layer interconnection 15.

Figure 7:
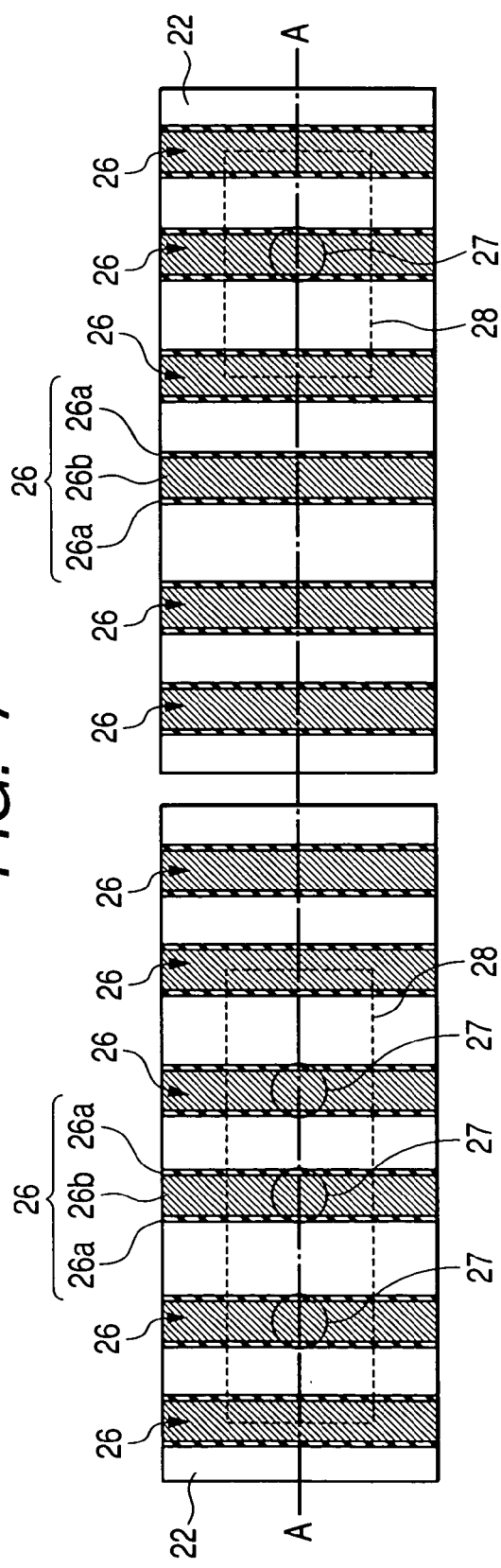
FIG. 7 is a cross sectional view along line A-A in FIG. 6.

FIG. 7 shows a plan view for a main portion of a region corresponding to FIG. 6. FIG. 7 shows a forming position 27 for through holes to be connected with the second layer interconnection 26 and the upper layer. In a case where misalignment occurs for the through hole position by an exposure apparatus in the lithographic process and, further, an air gap is present below the through hole, a cleaning solution or Cu plating solution penetrates subsequently to bring about a problem of electric connection failure or increase of capacitance. Accordingly, for taking a countermeasure to the misaligned through hole (misalignment through hole), it is necessary to set a reservoir forming position 28 such that a reservoir of the insulative film is present below the via hole even when the misalignment should occur to attain a state identical with a usual interlayer structure. The method of forming the reservoir is to be described with reference to FIG. 8 and succeeding figures.

Figure 8:
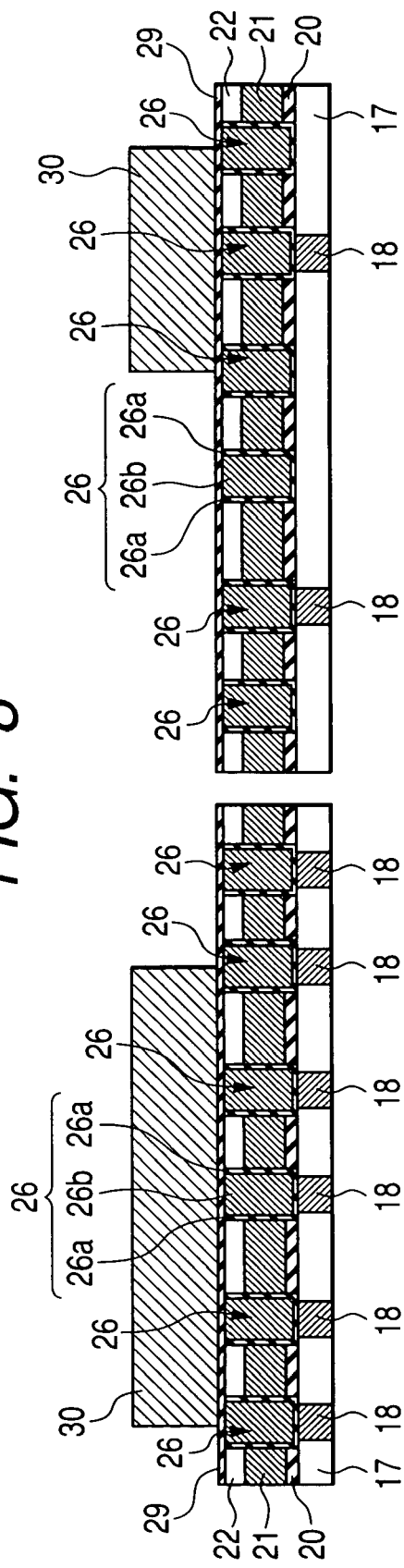
FIG. 8 is a cross sectional view for a main portion in the manufacturing step of a semiconductor device succeeding to FIG. 7.

FIG. 8 is a cross sectional view along line A-A in FIG. 7 succeeding to FIG. 7. Also in FIG. 8, portions corresponding to the structure below the insulative film 17 in FIG. 3 are not illustrated. A barrier insulative film 29 is formed to 20 to 50 nm thickness above the insulative film 22 and the second layer interconnection 26. The insulative film 29 is formed, for example, of a silicon nitride film and functions as a barrier insulative film for the copper interconnection. Accordingly, the insulative film 29 suppresses or prevents copper in the main conductor film 26b in the second layer interconnection 26 from diffusing into an interlayer insulative film 36 to be described subsequently. As other materials for the insulative film 29, a single film, for example, of a silicon carbide (SiC) film, a silicon carbonitride (SiCN) film or a silicon oxynitride (SiON) film may also be used. In a case of using the film described above, since the dielectric constant can be lowered remarkably compared with that of the silicon nitride film, the interconnection capacitance can be decreased to improve the operation speed of the semiconductor device. The silicon carbide film formed by a plasma CVD method includes, for example, BLOk (manufactured by AMAT Co.). The film forming gas is as has been described above. For forming the SiCN film, a gas mixture, for example, of helium (He), ammonia ($NH_3$), and trimethyl silane (3MS) is used. Further, the silicon oxynitride film formed by a plasma CVD method includes, for example, PE-TMS (manufactured by Canon Inc., dielectric constant=3.9). Upon forming the silicon oxynitride film, a gas mixture, for example, of trimethoxy silane (TMS) gas and a nitrogen oxide ($N_2O$) is used.

Then, a photoresist film is formed successively above the insulative film 29 and the photoresist film is patterned by exposure to form a photoresist pattern 30. In this case, the insulative film 29 functions as a film for preventing reaction between the photoresist pattern 30 and the copper interconnection 26. Upon forming such a reservoir layer, for improving the accuracy further, it is possible to use an anti-reflection film below the photoresist film and above the barrier insulative film 29. A structure of inserting at least one insulative film layer between the photoresist pattern for the reservoir and the lower layer interconnection is important.

Figure 9:
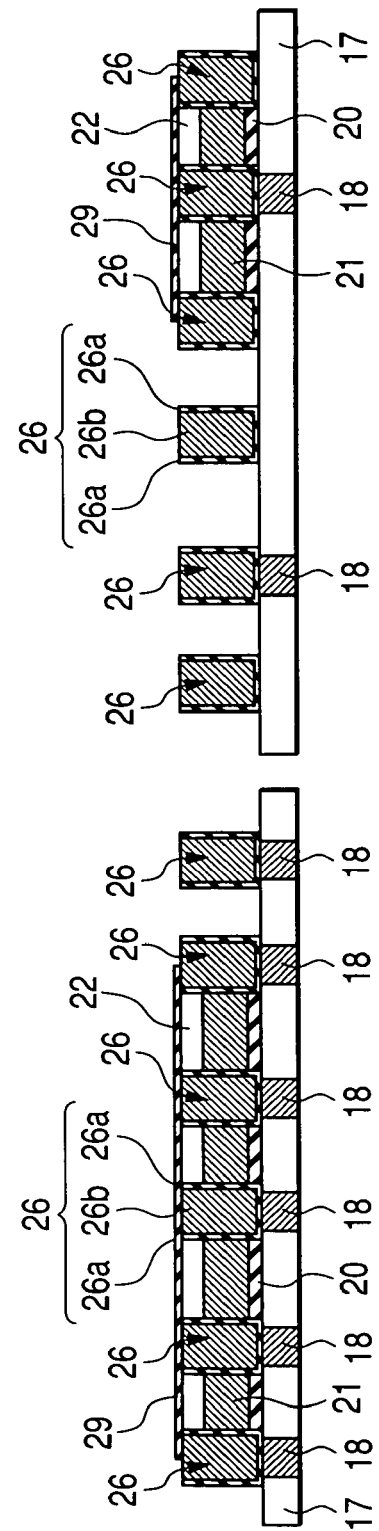
FIG. 9 is a cross sectional view for a main portion in the manufacturing step of a semiconductor device succeeding to FIG. 8.

Then, the insulative films 29, 22, 21, and 20 are removed selectively by a dry etching method using the photoresist pattern 30 as an etching mask to form an opening (FIG. 9). In this case, a $CF_4$ plasma treatment is applied to the substrate 1 (particularly, CMP surface at which the second layer interconnection 26 is exposed) to remove the insulating films 29, 22, 21, and 20 by disposing the semiconductor substrate 1 in the processing chamber of a plasma CVD apparatus and applying a plasma power by introducing a $CF_4$ gas. By the $CF_4$ plasma treatment described above, while organic byproducts or fluoride byproducts are slightly formed temporarily on the surface of the Cu interconnection of the film 26b, they can be removed by post cleaning (for example, cleaning with organic acid, cleaning with hydrofluoric acid, cleaning with organic alkali, or cleaning with a mixed solution thereof), or a hydrogen annealing treatment to be conducted subsequently. Further, in a case of using an organic film not containing silicon such as SILK to the insulative film 21, a reducing plasma such as in ammonia or an N2/H2 gas mixture is used for the etching of the insulative film 21. The plasma treatment means to expose the substrate surface or the surface of a material such as an insulative film or metal film when such material is formed on the substrate to a circumstance in a plasma state and give chemical or mechanical (bombardment) effects of plasmas to the surface for processing. Further, plasmas in the reducing atmosphere mean a plasma circumstance in which reactive spices such as radicals, ions, atoms, molecules, etc. having a reducing function, that is, a function of extracting oxygen are present predominantly.

Figure 10:
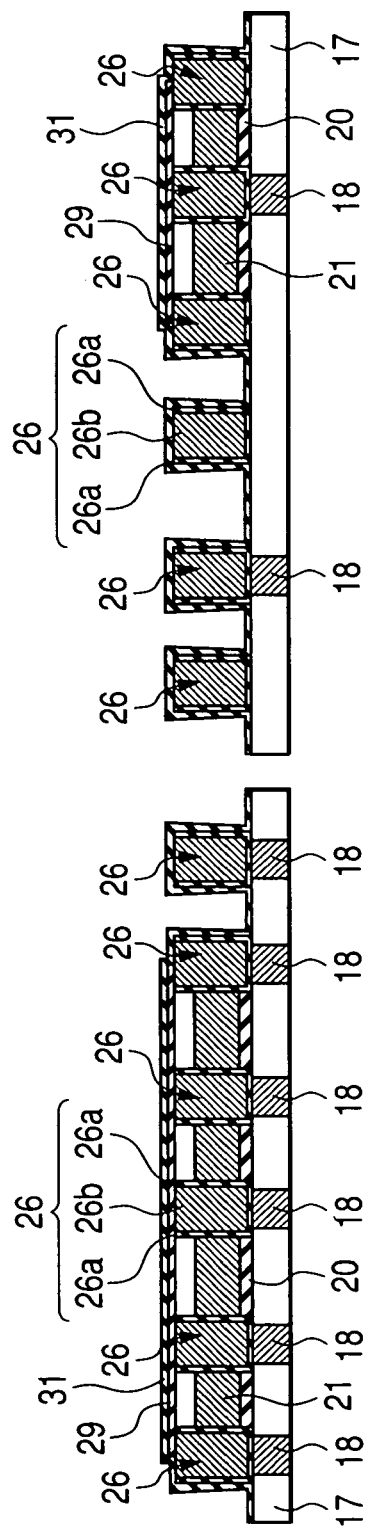
FIG. 10 is a cross sectional view for a main portion in the manufacturing step of a semiconductor device succeeding to FIG. 9.

FIG. 10 shows a cross sectional view for a main portion in the manufacturing step of a semiconductor device succeeding to FIG. 9. Also in FIG. 10, portions corresponding to the structure below the insulative film in FIG. 2 are not illustrated. After removing the insulative films 22, 21, 20, post-cleaning is conducted and then a insulative film 31 is formed above the entire main surface of the semiconductor substrate 1 by a plasma CVD method or the like. That is, the insulative film 31 is formed to 20 to 50 nm so as to cover the upper surface and the lateral surface of the second layer interconnection 26, the barrier insulative film 29 and the insulative film 17 used for forming the reservoir. The insulative film 31 comprises, for example, a silicon nitride film and functions as a barrier insulative film for the copper interconnection. Accordingly, the insulative film 31 suppresses or prevents copper in the main conductor film 26b of the second layer interconnection 26 from diffusing into an interlayer insulative film 36 to be formed subsequently. As other materials for the insulative film 31, a single film, for example, a silicon carbide (SiC) film, a silicon carbonitride (SiCN) film, or a silicon oxynitride (SiON) film may also be used. In the case of using the film described above, since the dielectric constant can be decreased greatly compared with the silicon nitride film, the interconnection capacitance can be decreased to improve the operation speed of the semiconductor device. The silicon carbide film formed by the plasma CVD method includes, for example, BLOk (manufactured by AMAT Co.). The film forming gas is as has been described above. Upon forming the SiCN film, a gas mixture, for example, of helium (He), ammonia ($NH_3$), and trimethyl silane (3MS) is used. Further, the silicon oxynitride film formed by a plasma CVD method includes, for example, PE-TMS (manufactured by Canon Inc., dielectric constant=3.9). Upon forming the silicon oxynitride film, a gas mixture, for example, of a trimethoxy silane (TMS) gas and a nitrogen oxide ($N_2O$) gas is used.

As shown in FIG. 10, in the interconnection structure prepared as described above, a structure in which the barrier insulative film in a region where the through hole is formed is thicker relative to the upper portion and the lateral portion of the interconnection not formed with the through hole is obtained. Since the barrier insulative film below the through hole also has a role as an etching stopper layer upon fabrication of the through hole, it is necessary that the film thickness is about 40 to 50 nm or more. Accordingly, in a case of forming the barrier insulative films 29 and 31, for example, to 25 nm respectively, since the barrier insulative film is 50 nm in the reservoir region where the through hole may be present, whereas only the barrier insulative film 31 of 25 nm is present in other periphery of the interconnection, and the reduction of the capacitance and the fabrication margin for the through hole can be attained efficiently.

Then, a method of forming a reservoir different from that described in FIG. 8 to FIG. 10 is to be described with reference to FIG. 11 to FIG. 17.

Figure 11:
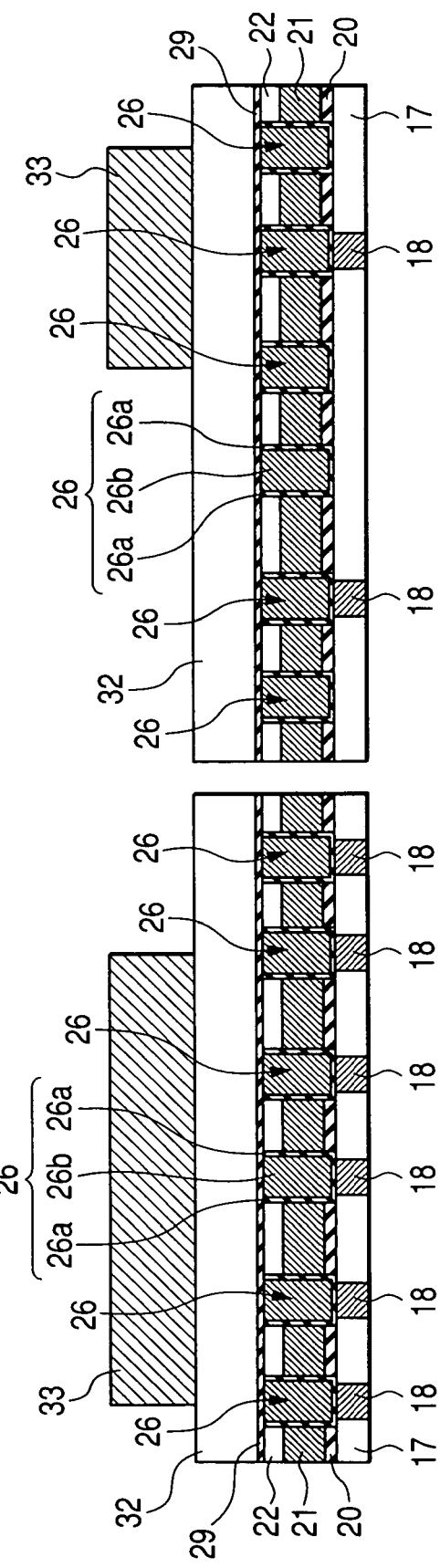
FIG. 11 is a cross sectional view for a main portion in the manufacturing step of a semiconductor device in another embodiment of the invention succeeding to FIG. 7.

FIG. 11 is a cross sectional view for a main portion in the manufacturing step of a semiconductor device as other embodiment of the invention. In the method of forming the through hole reservoir described for FIG. 8 to FIG. 10, since the etching is conducted by using the resist mask pattern 30, a residual Cu film may possibly be formed in the periphery of the second layer interconnection 26 depending on the dry etching apparatus. In view of the above, a method of forming a reservoir irrespective of dry etching apparatus is to be described with reference to FIG. 11 to FIG. 15. At first, as shown in FIG. 11, an insulative film 32, for example, a silicon oxide film or an $SiO_3$ film is formed to 100 to 400 nm above the barrier insulative film 29. Then, a photoresist film is formed successively on the insulative film 32, and the photoresist film is patterned by exposure to form a photoresist pattern 33. Upon forming the reservoir layer, an anti-reflection film can also be formed below the photoresist film and above the barrier insulative film for further improving the accuracy.

Then, as shown in FIG. 12, the insulative film 32 is etched by using the photoresist pattern 33 as a mask and etching is once stopped at the barrier insulative film 29. Then, as shown in FIG. 13, ashing is conducted to remove the resist pattern 33. This can prevent the formation of the residual Cu film re-sputtered on the side wall of the resist. Subsequently, as shown in FIG. 14, the insulative films 29, 22, 21, and 20 are etched by using a mask 32 for the insulative film. Then, after conducting post-cleaning and hydrogen annealing, a barrier insulative film 31 is formed by 20 to 50 nm to the upper surface and the lateral surface of the second layer interconnection 26 and the barrier insulative film 29 and the insulative film 17 used for forming the reservoir. With such a process, an interconnection structure equivalent with that in FIG. 10 is obtained as shown in FIG. 15.

Further, FIG. 16 shows a cross sectional view for a main portion in the manufacturing step of a semiconductor device as other embodiment of the invention succeeding to FIG. 13. In a case of etching the insulative films 22, 21, and 20 by using the insulative film pattern 32, when the selectivity to the insulative film 32 and the barrier insulative film 29 is low, after completely removing the barrier insulative film 29, a new barrier insulative film 34 is formed above the insulative film 22, the second layer interconnection 26 and the insulative film 27 as shown in FIG. 17. The insulative film 34 comprises, for example, a silicon nitride film and functions as a barrier insulative film for the copper interconnection. Accordingly, the insulative film 34 suppresses or prevents copper in the main conductor film 26b of the second layer interconnection 26 from diffusing into the interlayer insulative film 36 to be formed subsequently. As other materials for the insulative film 34, a single film, for example, of a silicon carbide (SiC) film, a silicon carbonitride (SiCN) film, or a silicon oxynitride (SiON) film may also be used. In the case of using the film described above, since the dielectric constant can be decreased greatly compared with the silicon nitride film, the interconnection capacitance can be decreased to improve the operation speed of the semiconductor device. The silicon carbide film formed by the plasma CVD method includes, for example, BLOk (manufactured by AMAT Co.). The film forming gas therefor is as has been described above. Upon forming the SiCN film, a gas mixture, for example, of helium (He), ammonia ($NH_3$), and trimethyl silane (3MS) is used. Further, the silicon oxynitride film formed by the plasma CVD method includes, for example, PE-TMS (manufactured by Canon Inc., dielectric constant=3.9). Upon forming the silicon oxynitride film, a gas mixture, for example, of a trimethoxy silane (TMS) gas and a nitrogen oxide ($N_2O$) gas is used.

Figure 18:
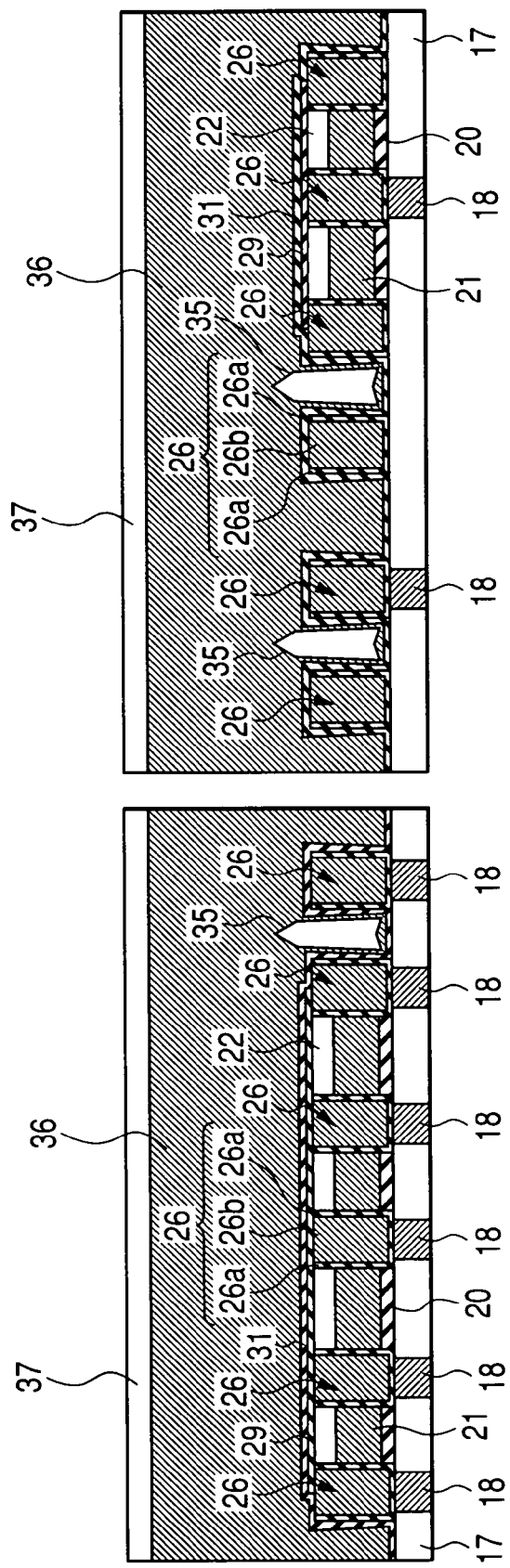
FIG. 18 is a cross sectional view for a main portion in the manufacturing step of a semiconductor device succeeding to FIG. 10 or FIG. 15.

FIG. 18 shows a cross sectional view for a main portion in the manufacturing step of a semiconductor device as an embodiment of the invention succeeding to FIG. 10 or FIG. 15. Insulative films 36 and 37 are formed above the barrier insulative film 31. For the insulative film 36, a Low-K insulative film such as SiOF or SiOC is used and, for the insulative film 37, a silicon oxide film or the like is used as a cap for the Low-K insulative film. For the sake of simplifying the step, the insulative film 37 may be saved and a single film of the insulative film 36 such as a silicon oxide film or SiOC film can also be formed.

In this embodiment, the insulative film 36 is formed under the condition that the insulative film 36 is not formed conformally between the closest interconnections (between minimum adjacent interconnections, between minimum pitch interconnections). The minimum adjacent interconnections correspond to the interconnections where the distance between the interconnections adjacent to each other is minimum in the identical layer interconnections (distance between adjacent interconnections). Between the closest interconnections, reduction of the parasitic capacitance is more important.

Between the closest interconnections, along with the proceeding of deposition of the insulative film 36, reaction species become less intruding gradually being hindered by deposits near the upper portion of the opposing lateral surfaces of the interconnection (opposing interconnection surfaces). Accordingly, the deposition rate near the lower portion on the opposing interconnection lateral surfaces is lower compared with the deposition rate near the upper portion. Accordingly, the thickness of the insulative film 36 deposited on the opposing interconnection lateral surfaces is not uniform but the thickness near the upper portion is larger than that near the lower portion. Such a phenomenon becomes more remarkable between the interconnections closest of the second layer interconnection 26, that is, between the closest interconnections to each other in the second layer interconnection 26.

Accordingly, between the closest interconnections of the second layer interconnection 26, the insulation film 36 does not form a conformal shape reflecting the shape of the second layer interconnection 26 but forms an air gap 35 as shown in FIG. 18. Further, for the formation of the insulative film 36, a plasma CVD method or the like can be used and the air gap portion 35 as described above can be formed easily between the closest interconnections, for example, by controlling the film forming condition for the insulative film 36. Further, in this embodiment, since the upper surface and the lateral surface of the second layer interconnection 26 are covered with the insulative film 31 as the barrier insulative film, it is also possible to save the conductive barrier film 26a in the second layer interconnection 26 and the second layer interconnection 26 can be formed only with the main conductor film 26b comprising copper. After forming the insulative films 36 and 37, for eliminating the step formed between the interconnections, interlayer CMP is applied to conduct planarization.

Figure 19:
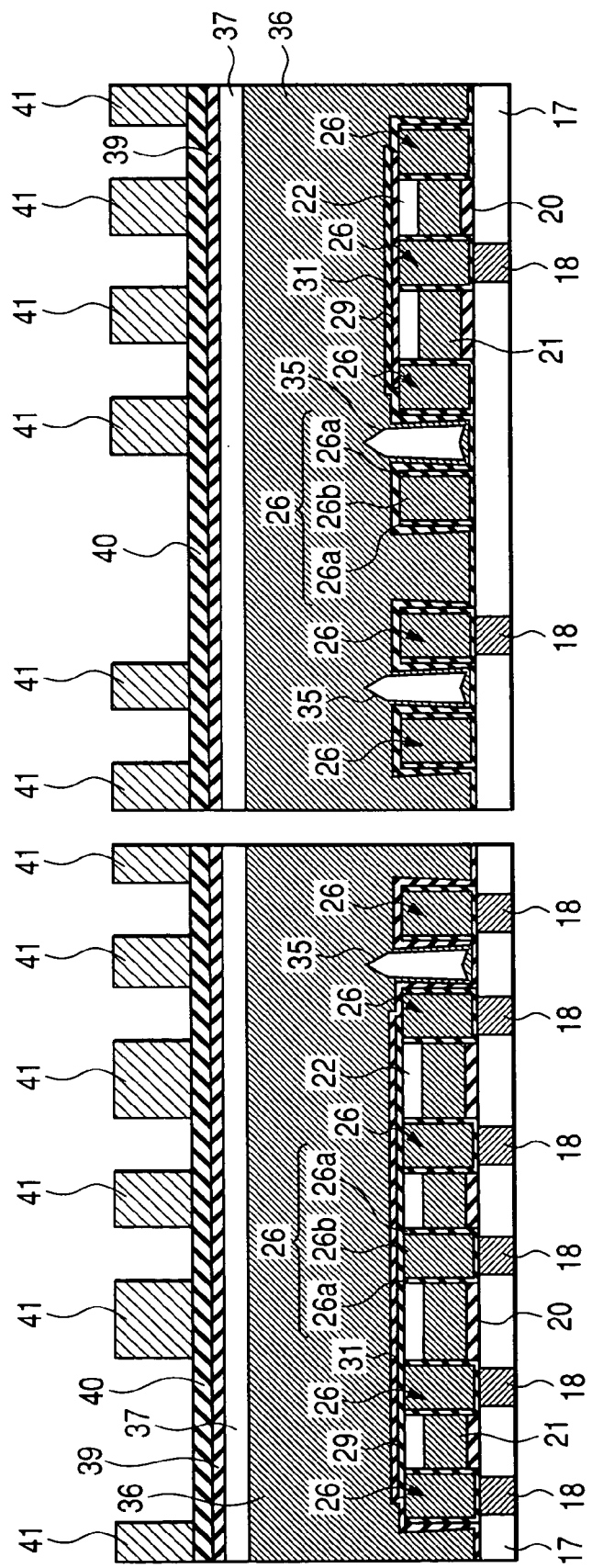
FIG. 19 is a cross sectional view along line A-A in FIG. 18.
Figure 20:
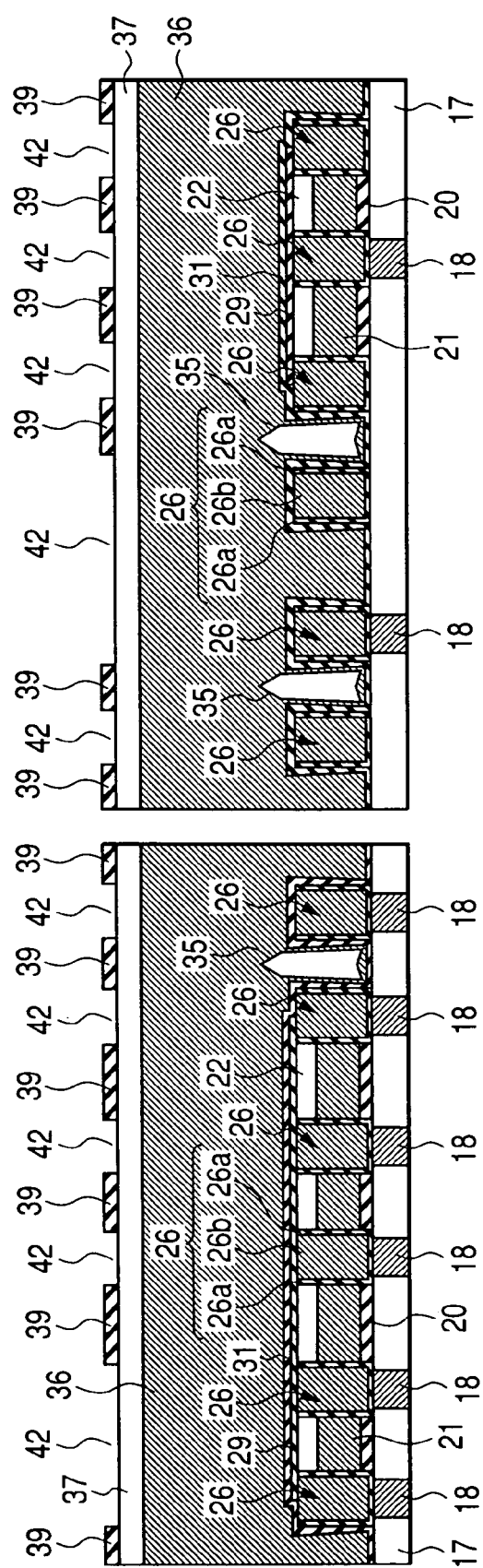
FIG. 20 is a cross sectional view for a main portion in the manufacturing step of a semiconductor device succeeding to FIG. 19.

Then, after forming the insulative film 39, as shown in FIG. 19, an anti-reflection film 40 and a photoresist film are formed successively above the insulative film 39, and the photoresist film is patterned by exposure to form a photoresist pattern 41. Then, the anti-reflection film 40 and the insulative film 39 are removed selectively by a dry etching method using the photoresist pattern 41 as an etching mask to selectively remove the anti-reflective film 40 and the insulative film 39 and ashing is conducted to remove the anti-reflective film and the photoresist. As a result, as shown in FIG. 20, an opening 42 that subsequently forms an interconnection trench can be prepared.

Figure 21:
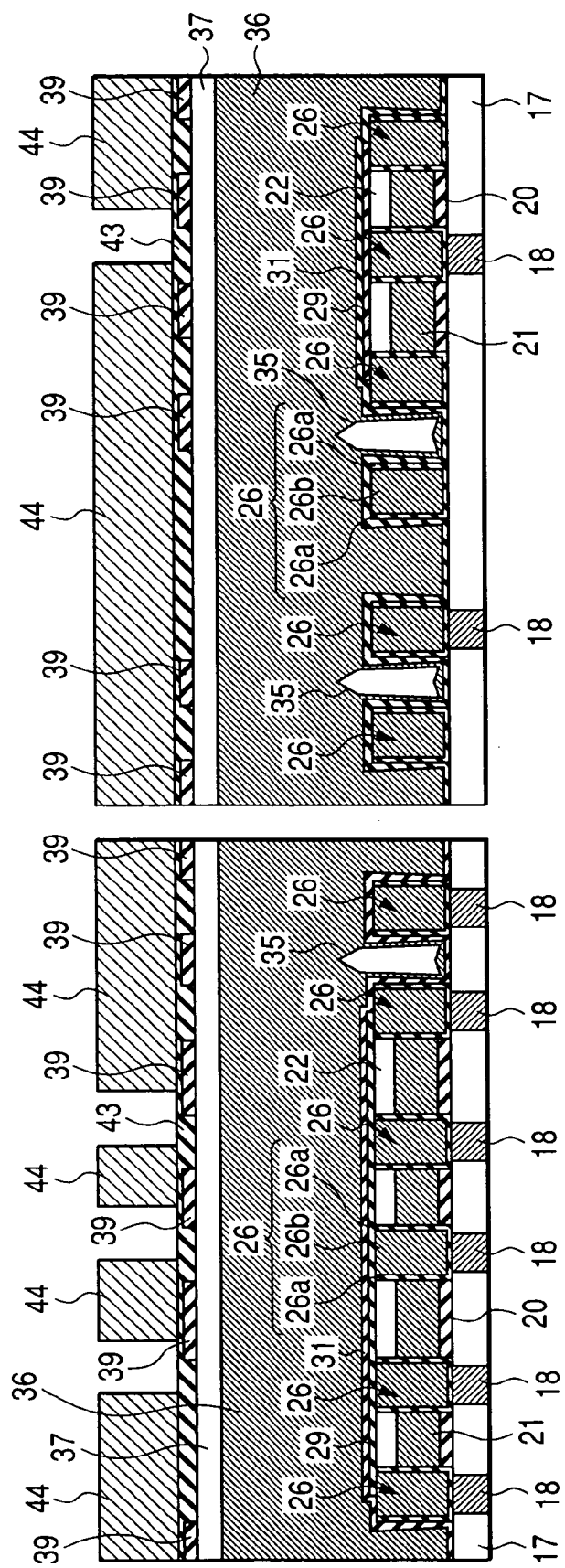
FIG. 21 is a cross sectional view for a main portion in the manufacturing step of a semiconductor device succeeding to FIG. 20.
Figure 22:
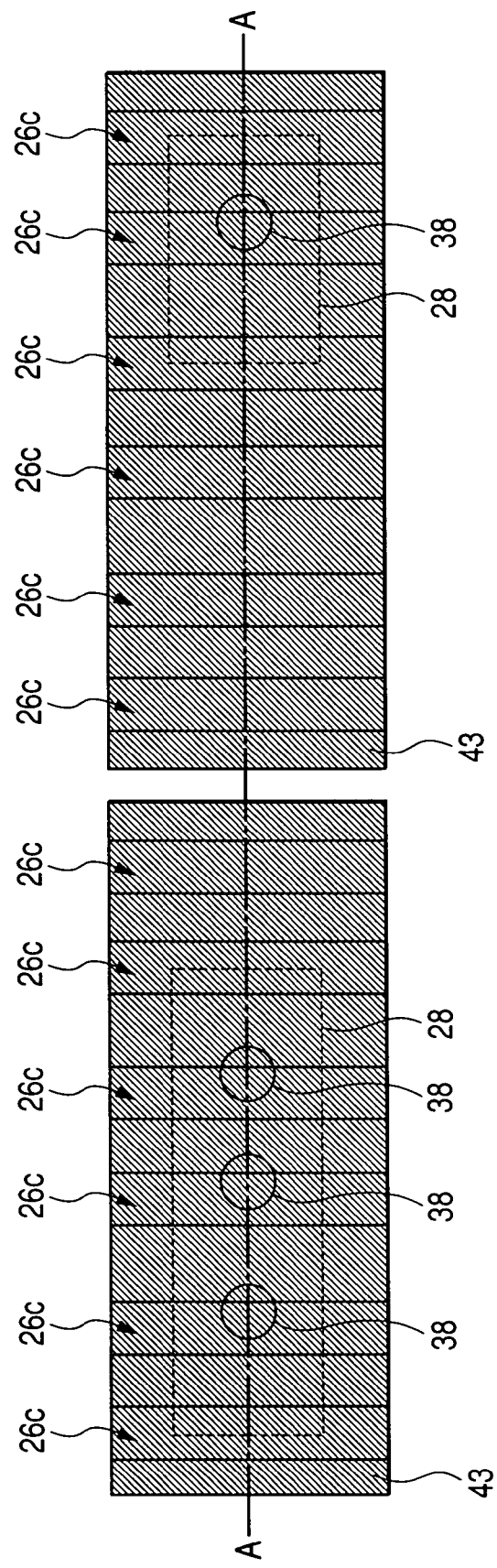
FIG. 22 is a cross sectional view for a main portion in the manufacturing step of a semiconductor device succeeding to FIG. 21.

Then, patterning is conducted for forming through a hole. As shown in FIG. 21, an anti-reflective film 43 and a photoresist film are formed successively above the insulative films 37 and 39, and the photoresist film is patterned by exposure to form a photoresist pattern 44. FIG. 22 shows a plane view for a main portion of a region corresponding to FIG. 2 in the manufacturing step of a semiconductor device succeeding to FIG. 21. FIG. 22 shows a second layer interconnection position 26c, a misaligned position 38 for a through hole to be connected with the second layer interconnection and the third layer interconnection, and a reservoir forming position 28 formed at the periphery of the second layer interconnection. In this case, the through hole 38 shows an actually misaligned position upon exposure of the via hole pattern in FIG. 21.

Figure 23:
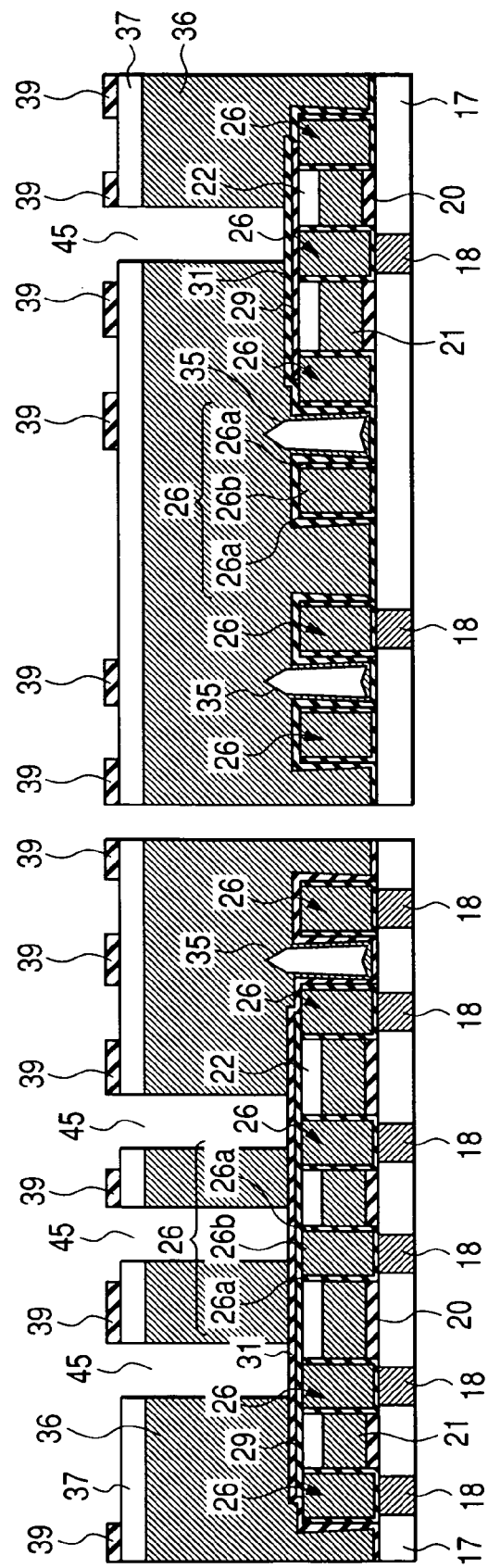
FIG. 23 is a cross sectional view for a main portion in the manufacturing step of a semiconductor device succeeding to FIG. 22.

FIG. 23 is a cross sectional view along line A-A in FIG. 22 succeeding to FIG. 22. The anti-reflective film 43 and the insulative films 39, 37, and 36 are selectively removed by a dry etching method using a photoresist pattern 44 as an etching mask, and ashing is conducted to remove the anti-reflective film and the photoresist film and form a through hole opening 45.

Figure 24:
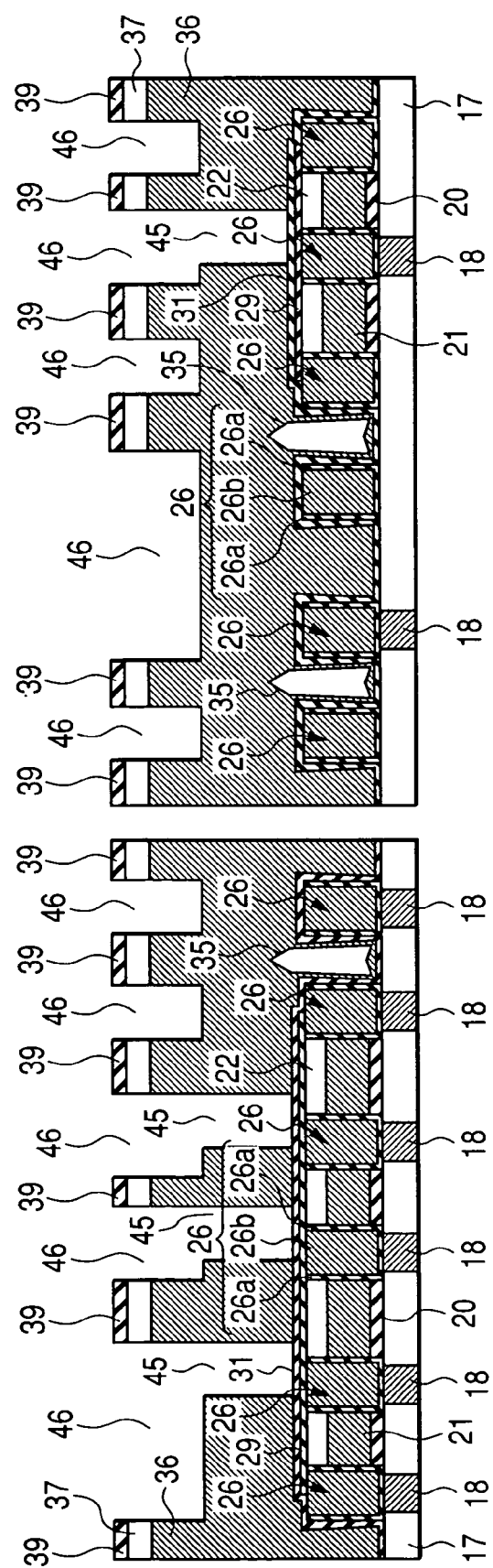
FIG. 24 is a cross sectional view for a main portion in the manufacturing step of a semiconductor device succeeding to FIG. 23.
Figure 25:
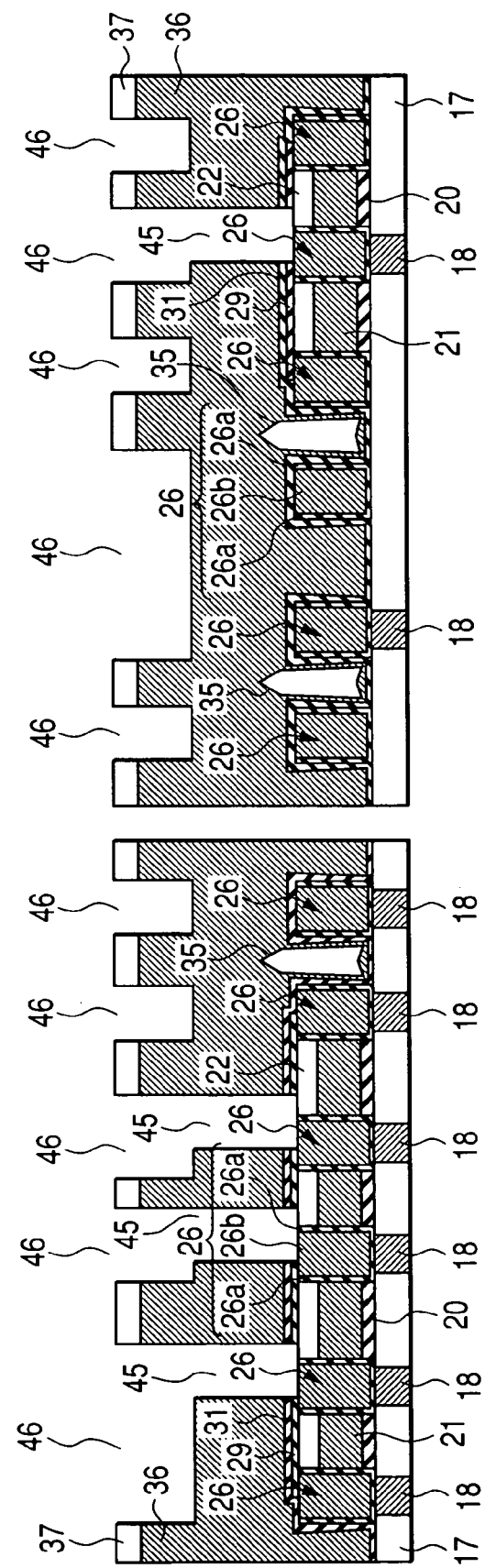
FIG. 25 is a cross sectional view for a main portion in the manufacturing step of a semiconductor device succeeding to FIG. 24.

Then, as shown in FIG. 24, trench fabrication is conducted by using an insulative mask 39 to form a trench opening 46 and, successively, the barrier insulative films 29 and 31 present below the though hole are removed simultaneously with the insulative mask 39, as shown in FIG. 25.

Then, a thin conductive barrier film of about 5 to 50 nm thickness (fist conductor film) 47a comprising, for example, titanium nitride (TiN) is formed above the entire main surface of the substrate 1 by using a sputtering method or the like. For the conductive barrier film 47a, various materials described for 26a above can be applied in addition to the titanium nitride. Successively, a main conductor film (second conductor film) 47b, for example, comprising a relatively thick copper of about 800 to 1600 nm thickness is formed over the conductive barrier film 47a. The main conductor film 47b can be formed by using, for example, a CVD method, a sputtering method, or a plating method. Then, a heat treatment is applied to the substrate 1 in a non-oxidative atmosphere, for example, at about 150 to 400° C. (for example, a hydrogen atmosphere or nitrogen atmosphere), thereby reflowing the main conductor film 47b to fill copper inside the interconnection trenches 45 and 46 with no air gaps.

Figure 26:
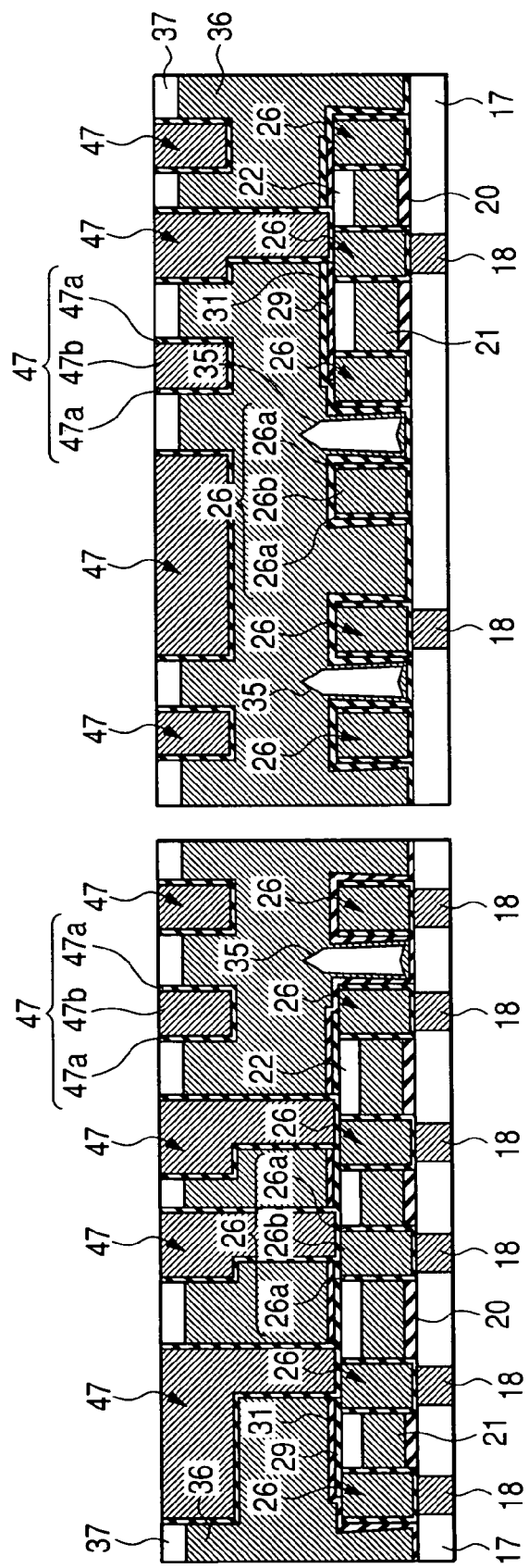
FIG. 26 is a cross sectional view for a main portion in the manufacturing step of a semiconductor device succeeding to FIG. 25.

Then, the main conductor film 47b and the conductive barrier film 47a are polished by a CMP method to form a third layer interconnection (interconnection) 47 comprising a relatively thin conductive barrier film 47a and a relatively thick main conductor film 47b in the interconnection trenches 45 and 46 as shown in FIG. 26. The third layer interconnection 47 is connected electrically with the first layer interconnection wiring 15 and the second layer interconnection 26 by way of the through hole 45.

Figure 27:
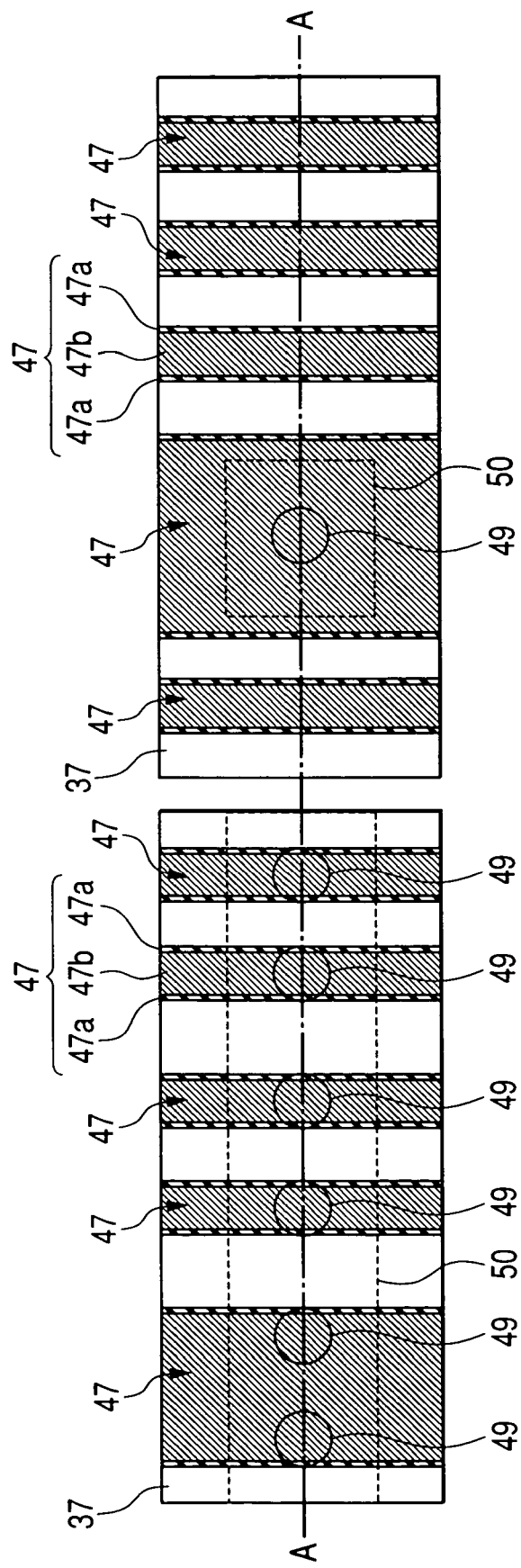
FIG. 27 is a cross sectional view along line A-A in FIG. 26.

FIG. 27 shows a plane view for a main portion of a region corresponding to FIG. 2 in the manufacturing steps of a semiconductor device succeeding to FIG. 26. FIG. 27 shows forming position 49 for a through hole to be connected with the third layer interconnection 47, the second layer interconnection and the upper layer. Like the description for FIG. 7, as a countermeasure for the misaligned through hole (misalignment through hole), a reservoir forming position 50 is set such that the restricted portion of the third layer interconnection is in a state identical with usual inter-layer structure.

Figure 28:
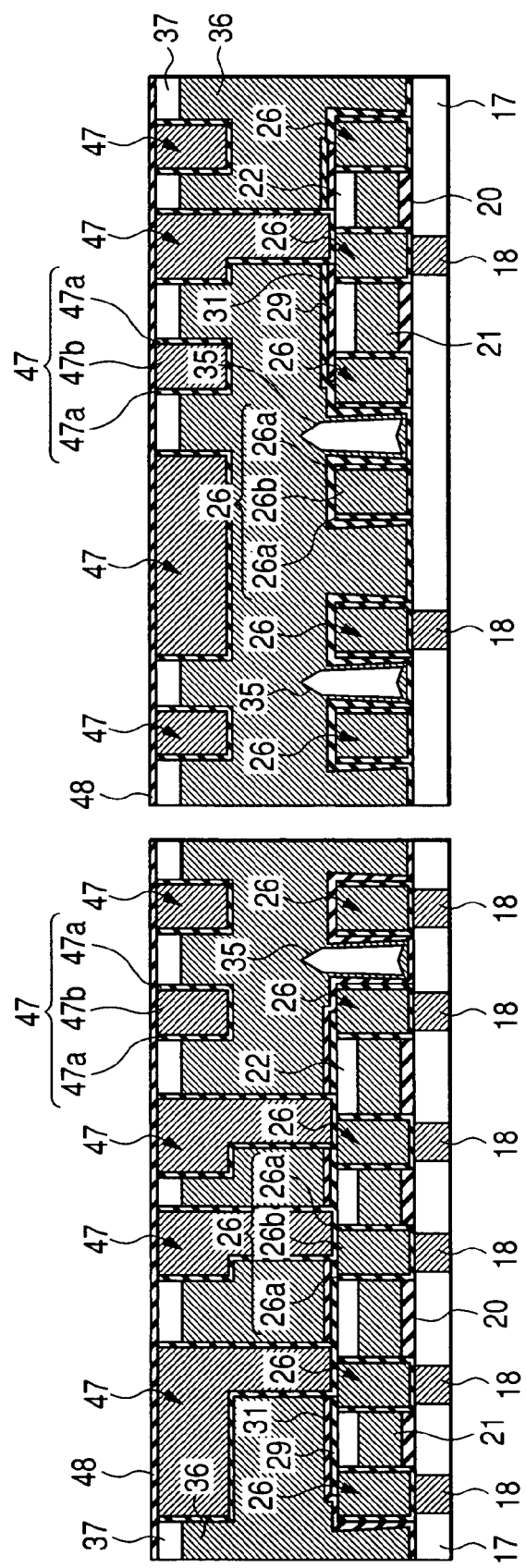
FIG. 28 is a cross sectional view for a main portion in the manufacturing step of a semiconductor device succeeding to FIG. 27.
Figure 29:
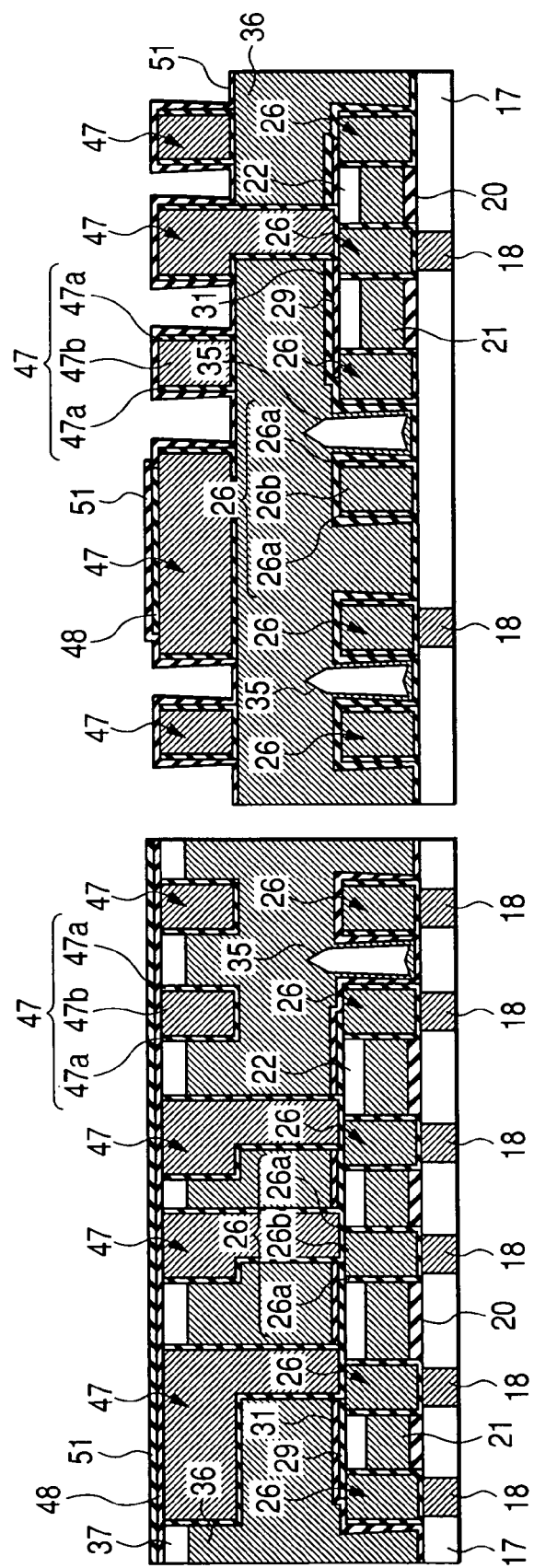
FIG. 29 is a cross sectional view for a main portion in the manufacturing step of a semiconductor device succeeding to FIG. 28.

FIG. 28 shows a cross sectional view along line A-A in FIG. 27 succeeding to FIG. 27. Also in FIG. 28, the portions corresponding to the structure below the insulative film 17 in FIG. 3 are not illustrated. A barrier insulative film 48 is formed to 20 to 50 nm thickness above the insulative film 37 and the third layer interconnection 47.

The insulative film 48 comprises, for example, a silicon nitride film and functions as a barrier insulative layer for the copper interconnection. Accordingly, the insulative film 48 suppresses or prevents copper in the main conductor film 47b of the third layer interconnection 47 from diffusing into an inter-layer insulative film 53 to be formed subsequently. As other materials for the insulative film 48, a single film, for example, of a silicon carbide (SiC) film, a silicon carbonitride (SiCN) film, or a silicon oxynitride (SiON) film may also be used. In the case of using the film described above, since the dielectric constant can be decreased greatly compared with the silicon nitride film, the interconnection capacitance can be decreased to improve the operation speed of the semiconductor device. Since the preparation method is identical with that described above for FIG. 8 and the insulative film 29, it is not illustrated.

Then, in the same manner as described for FIG. 7 to FIG. 10, a reservoir 50 is formed at the periphery of the third layer interconnection 47. In FIG. 28, after etching a barrier insulative films 48 and insulative films 37 and 36 by a resist mask pattern, a barrier insulative film 51 is additionally formed to 20 to 50 nm thickness above and on the lateral wall of the insulative films 36, 37, the barrier insulative film 48 and the third layer interconnection 47. The insulative film 51 comprises, for example, a silicon nitride film and functions as a barrier insulative layer for the copper interconnection. Accordingly, the insulative film 48 suppresses or prevents copper in the main conductor film 47b of the third layer interconnection 47 from diffusing into an inter-layer insulative film 53 to be formed subsequently. As other materials for the insulative film 51, a single film, for example, of a silicon carbide (SiC) film, a silicon carbonitride (SiCN) film, or a silicon oxynitride (SiON) film may also be used. In the case of using the film described above, since the dielectric constant can be decreased greatly compared with the silicon nitride film, the interconnection capacitance can be decreased to improve the operation speed of the semiconductor device. Since the preparation method is identical with that described above for FIG. 8 and the insulative film 29, it is not illustrated.

Figure 30:
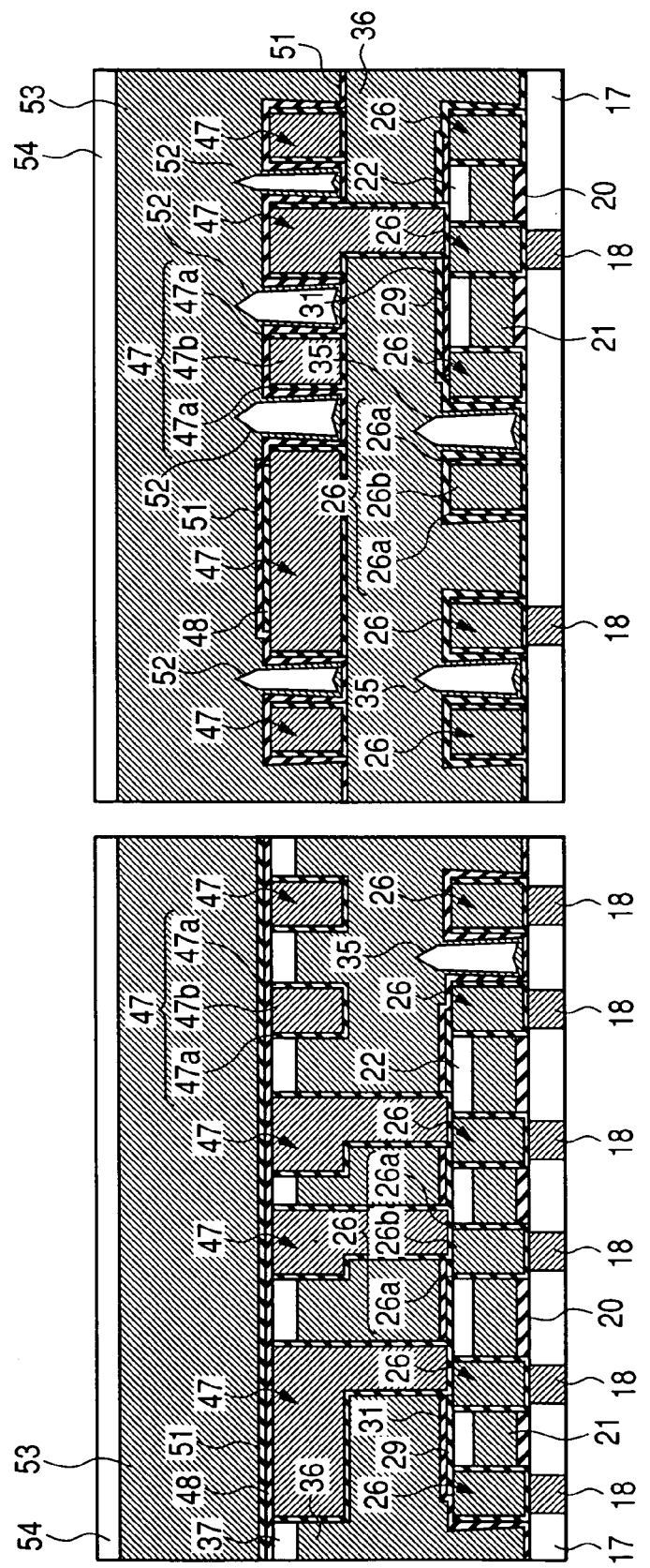
FIG. 30 is a cross sectional view for a main portion in the manufacturing step of a semiconductor device succeeding to FIG. 29.

Then, as shown in FIG. 30, insulative films 53 and 54 are formed and planarized by an insulative film CMP. Also in a case succeeding to the upper layer, the steps are repeated by the method shown in FIG. 19 to FIG. 30 and the upper layer interconnections after the fourth layer interconnection can be formed. Further, it is also possible to form the first layer interconnection 15 as a copper interconnection formed in the same manner as the second layer interconnection 26, and form the second layer interconnection 26 as a copper interconnection formed in the same manner as the third layer interconnection 47.

According to this embodiment, the CMP surface (CMP-polished surface) is not present between the interconnections of the identical layer. That is, most of the insulative films 21, 22 and 36 and 37 polished by the CMP step for forming the second layer interconnection 26 and the third layer interconnection 47 are removed, and barrier insulative films 31 and 51 are formed so as to cover the second layer interconnection 26 and the third layer interconnection 47. Accordingly, in the second layer interconnection 26 and the third layer interconnection 47, the upper surfaces of the interconnections in the identical layer are not connected with each other by way of the CMP surface in the regions other than the restricted reservoir region. This can improve the dielectric withstanding voltage between the interconnections and also improve the TDDB life. That is, the reliability of the semiconductor device can be improved.

Further, since the air gaps 35 and 52 are formed each between the closest interconnections in the identical layer interconnection for which decrease of the capacitance is most required, the capacitance between the interconnections can be decreased efficiently. Even in a case of using a material of relatively high dielectric constant for the barrier insulative films 31 and 51 of the interconnection, the capacitance between the interconnections can be decreased. Further, in a region where the distance between adjacent interconnections is large in the identical layer interconnection, a Low-K material film is deposited without forming the air gap between the interconnections. Accordingly, the entire mechanical strength can be maintained.

In this embodiment, while the insulative film region is formed by the reservoirs 28 and 50 in the periphery of the through hole connected with the under layer interconnection thereof, since the region is smaller relative to the closest interconnection pattern region, the effect of decreasing the capacitance by the air gap can be provided sufficiently.

Further, in this embodiment, the air gap 35 or 52 may be formed not only between the closest interconnections but also between the interconnections in which the adjacent interconnection distance is relatively small and the parasitic capacitance therebetween is intended to be decreased. Formation of the air gap depending on the extent of the distance between the interconnections can be controlled by adjusting the conditions for forming the barrier insulative film 31 or 51, or conditions for forming the insulative film 36 or 52. Thus, it is possible to decrease the capacitance between interconnections by forming the air gap between adjacent interconnections in a region of high interconnection pattern density and maintain the mechanical strength in the region of low interconnection pattern density by filling the air gap between the interconnections with the Low-K material.

The present inventor has studied the effect of decreasing the capacitance of the interconnection structure in this embodiment by experiment and simulation. As a comparative example, a copper interconnection structure formed by constituting the insulative film for burring the interconnection and the interlayer insulative film with the Low-K material and by using the general damascene technique was used.

As a result, in the interconnection structure of this embodiment, the capacitance between the interconnections can be decreased by about 20 to 30% relative to the comparative example. Further, the capacitance between the upper layer interconnection and the lower layer interconnection scarcely changed and only the capacitance between the interconnections of the identical layer was decreased. Accordingly, the effect of cross-talk between the interconnections can be decreased. Further, an effective dielectric constant $\in \gamma$ ($\in \gamma$: about 3.1 in the copper interconnection structure of the comparative example) can be greatly decreased to about 2.3 to 2.7. Accordingly, by using the Low-K material of the identical generation for the inter-layer insulative film, an interconnection structure of low capacitance for one or more future generation can be realized.

Embodiment 2

Figure 31:
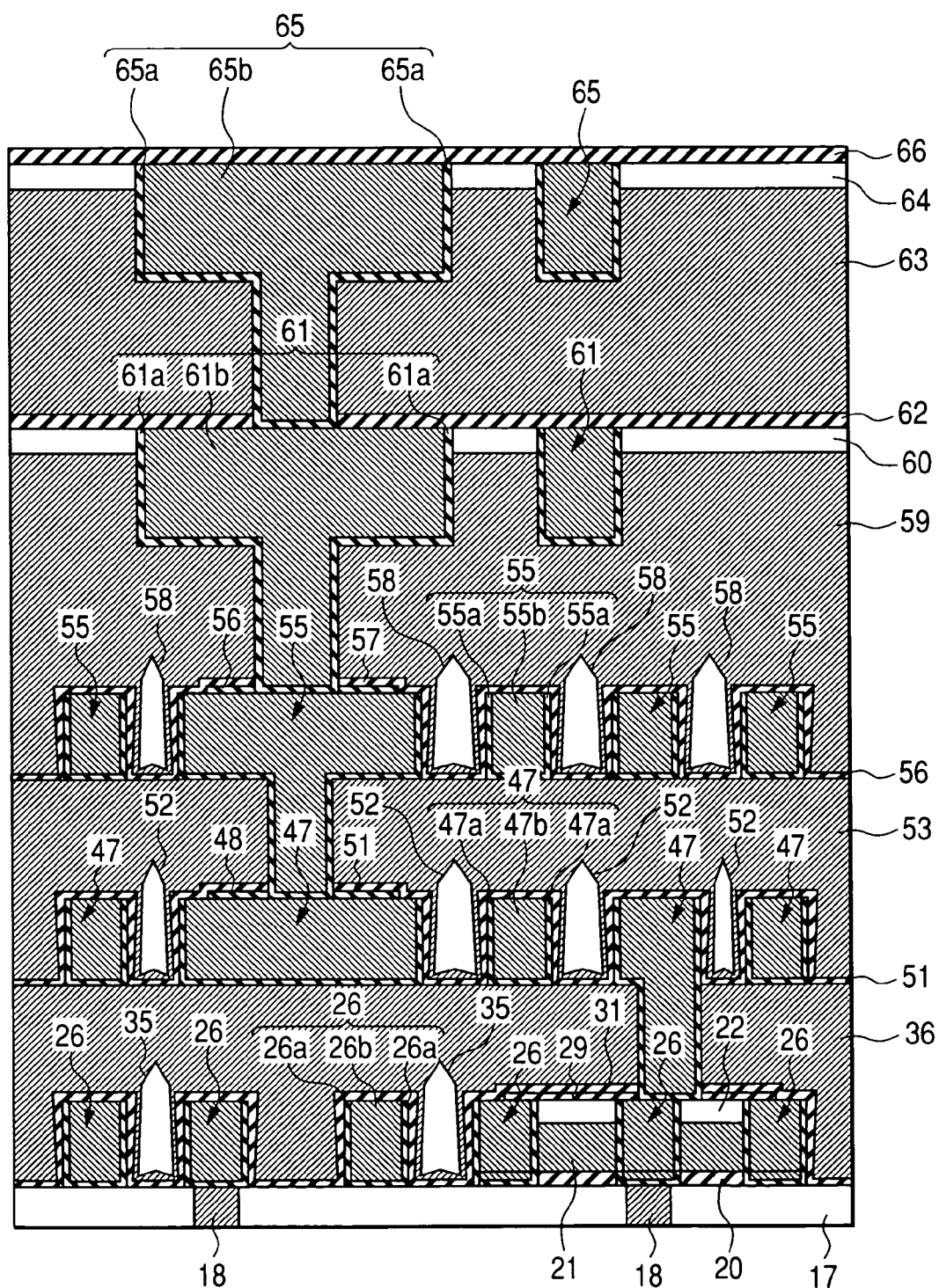
FIG. 31 is a cross sectional view for a main portion in the manufacturing step of a semiconductor device as other embodiment of the invention.

FIG. 31 is a cross sectional view for a main portion in the manufacturing step of a semiconductor device as other embodiment of the invention. The semiconductor device of this embodiment has a multi-layered interconnection structure having, in combination, a structure with an air gap being formed between adjacent interconnections and having an interconnection layer not connecting adjacent interconnections with a CMP surface and having a reservoir as in the second layer interconnection layer 26 and the third layer interconnection 47 of the embodiment 1 and an interconnection layer formed by using a general embedding interconnection technique. In FIG. 31, since the steps up to the formation of the insulative film 60 above the fourth layer interconnection 55 are substantially identical with the manufacturing steps of FIG. 4 to FIG. 10 and FIG. 18 to FIG. 30 of the embodiment 1, explanation therefor is omitted and only the subsequent manufacturing steps are to be described herein.

The fifth and succeeding interconnection layers are formed by using a general embedding interconnection technique, for example, a general dual damascene technique. At first, after planarizing the insulative film 60 by CMP, a fifth layer interconnection is formed. Then, a fifth layer interconnection 61 buried in interconnection trenches formed in the insulative films 60, 59, 57, and 56 is formed by using the dual damascene technique. Then, an insulative film 62 comprising, for example, silicon nitride, silicon carbide, silicon carbonitride, or silicon oxynitride film is formed above the insulative film 60 including the upper surface of the fifth layer interconnection 61. Then, insulative films 63 and 64 comprising, for example, a Low-K material are formed above the insulative film 62. In the same manner, a sixth layer interconnection 65 buried in the interconnection trench formed in the insulative films 62 to 64 is formed by using the dual damascene technique. Then, an insulative film 66 comprising the same material as the insulative film 62, for example, silicon nitride is formed as a barrier insulative film above the insulative film 64 including the upper surface of the sixth layer interconnection 65.

As the insulative films 36, 53, 59 and 63, a film formed by using the CVD method, for example, a silicon oxide film, an FSG (SiOF material) film, a SiOC film, or a porous silicon (Porous-Si) material film can also be used.

In the multi-layered interconnection structure, the capacitance between the interconnections tends to increase and the TDDB life tends to be decreased in the interconnection layer with the distance between adjacent interconnections being relatively small, that is, with a relatively small interconnection pitch. According to this embodiment, in the interconnection layer where the capacitance between the interconnections tends to increase and the TDDB life tends to decrease, the TDDB life can be improved by eliminating the CMP surface between the interconnections in the identical layer other than the restricted reservoir region, and the capacitance between the interconnections can be decreased by forming the air gap between the closest interconnections in the identical interconnection while keeping the contact favorably for misaligned via hole by using the reservoir structure.

Embodiment 3

Figure 32:
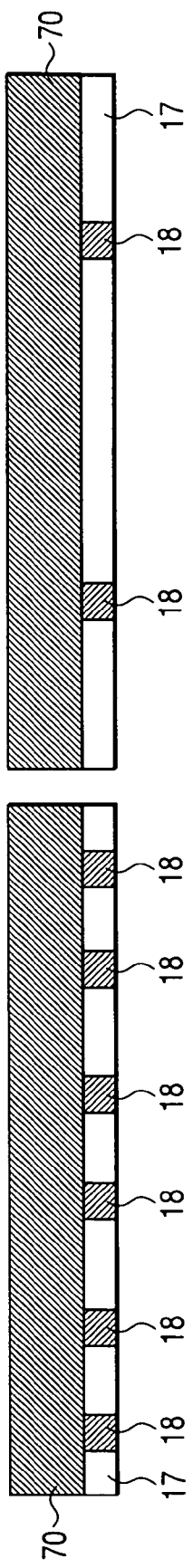
FIG. 32 is a cross sectional view for a main portion in the manufacturing step of a semiconductor device in other embodiment of the invention succeeding to FIG. 3.

FIG. 32 is a cross sectional view for a main portion in the manufacturing step of a semiconductor device as other embodiment of the invention succeeding to FIG. 3. Also in FIG. 32, those portions corresponding to the structure below the insulative film 17 in FIG. 3 are not illustrated in the drawing.

This embodiment shows an air gap-interconnection in a case of forming an interconnection layer from a conductive film typically represented by an aluminum (Al) interconnection by a dry etching method.

At first in this embodiment, as shown in FIG. 32, a conductive film 70 is formed over an insulative film 17 in which a through hole 18 is buried by a sputtering method or a CVD method. The conductive film 70 referred to herein is not restricted only to aluminum but may be changed variously. For example, it may also be a single film formed, for example, of aluminum (Al) or aluminum alloy, or a laminate metal film in which a metal film such as of titanium (Ti) or titanium nitride (TiN) is formed on at least one of upper and lower layers of the single film, or it may be made of a tungsten film.

Figure 33:
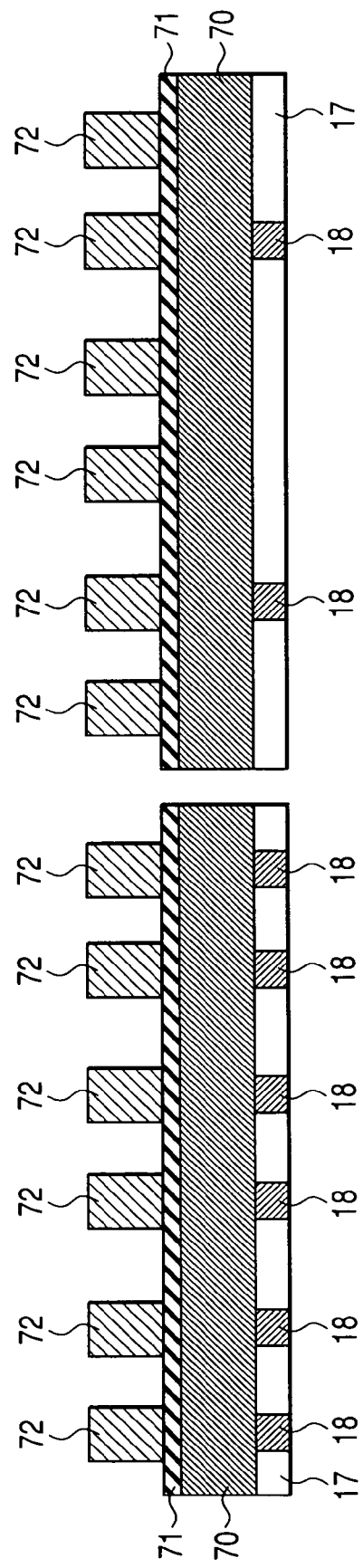
FIG. 33 is a cross sectional view for a main portion in the manufacturing step of a semiconductor device succeeding to FIG. 32.
Figure 34:
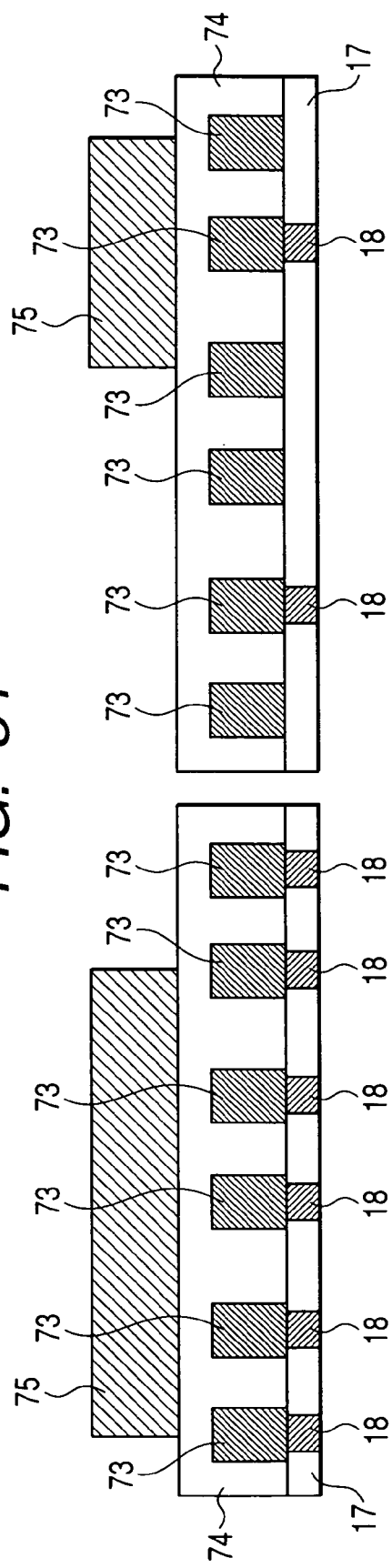
FIG. 34 is a cross sectional view for a main portion in the manufacturing step of a semiconductor device succeeding to FIG. 33.

Then, as shown in FIG. 33, an anti-reflective film 71 and a photoresist film are formed successively above the conductive film 70, and the photoresist film is patterned by exposure to form a photoresist pattern 72. Then, the anti-reflective film 71 is removed selectively by a dry etching method using the photoresist pattern 72 as an etching mask. Then, the conductive film 70 is selectively removed by a dry etching method using the photoresist pattern 72 as an etching mask, to form a second interconnection layer 73. Then, as shown in FIG. 34, an insulative film 74 is formed above the portion between the second interconnection layers and above the second interconnection layer under a conformal condition, and a photoresist pattern 75 for via hole reservoir is formed in the same manner as in FIG. 8.

Figure 35:
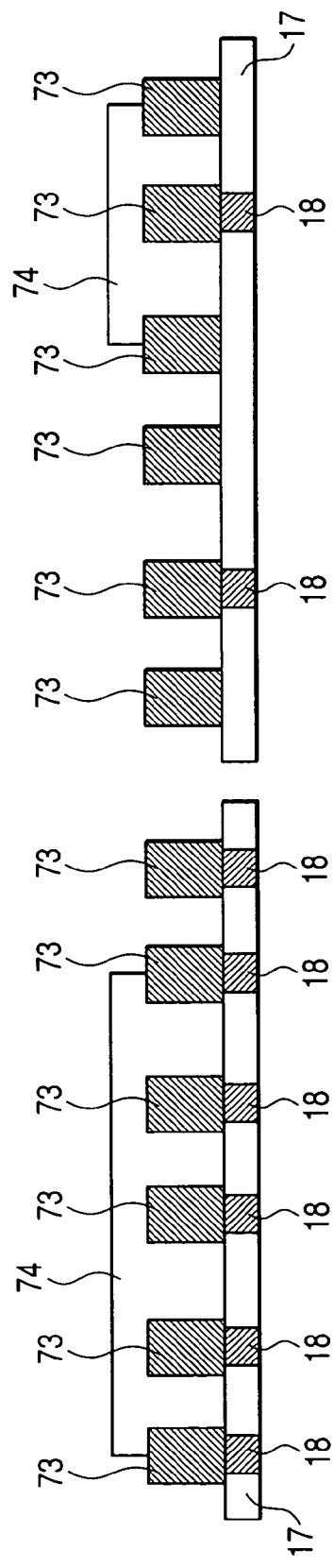
FIG. 35 is a cross sectional view for a main portion in the manufacturing step of a semiconductor device succeeding to FIG. 34.
Figure 36:
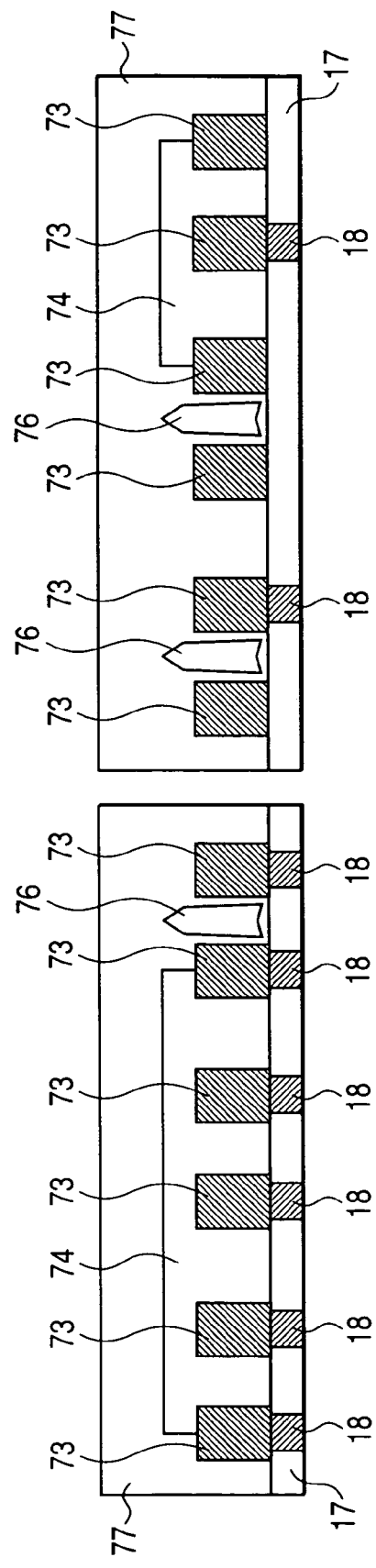
FIG. 36 is a cross sectional view for a main portion in the manufacturing step of a semiconductor device succeeding to FIG. 35.

Then, as shown in FIG. 35, an insulation film pattern for reservoir is formed by dry etching the insulative film 74 using the photoresist pattern 75 for reservoir as a mask. A structure of inserting at least one or more insulative film layer between the photoresist pattern for reservoir and the lower layer interconnection is important. Then, as shown in FIG. 36, an insulative film 77 is formed under not conformal condition to selectively form an air gap 76 between adjacent interconnections where the space is narrow and an interlayer insulation film CMP is conducted to planarize the upper portion of the insulative film 77.

Figure 37:
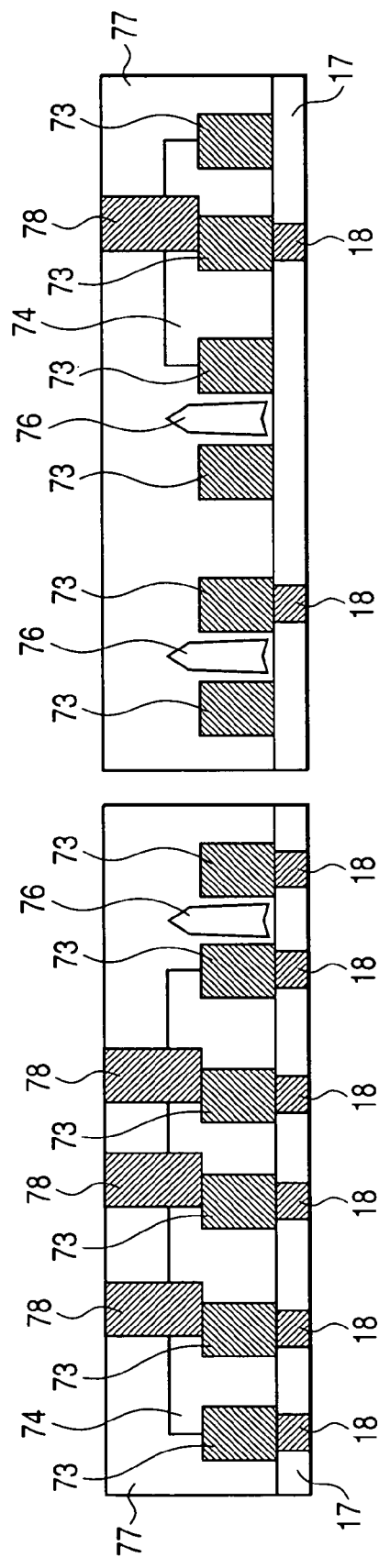
FIG. 37 is a cross sectional view for a main portion in the manufacturing step of a semiconductor device succeeding to FIG. 36.
Figure 38:
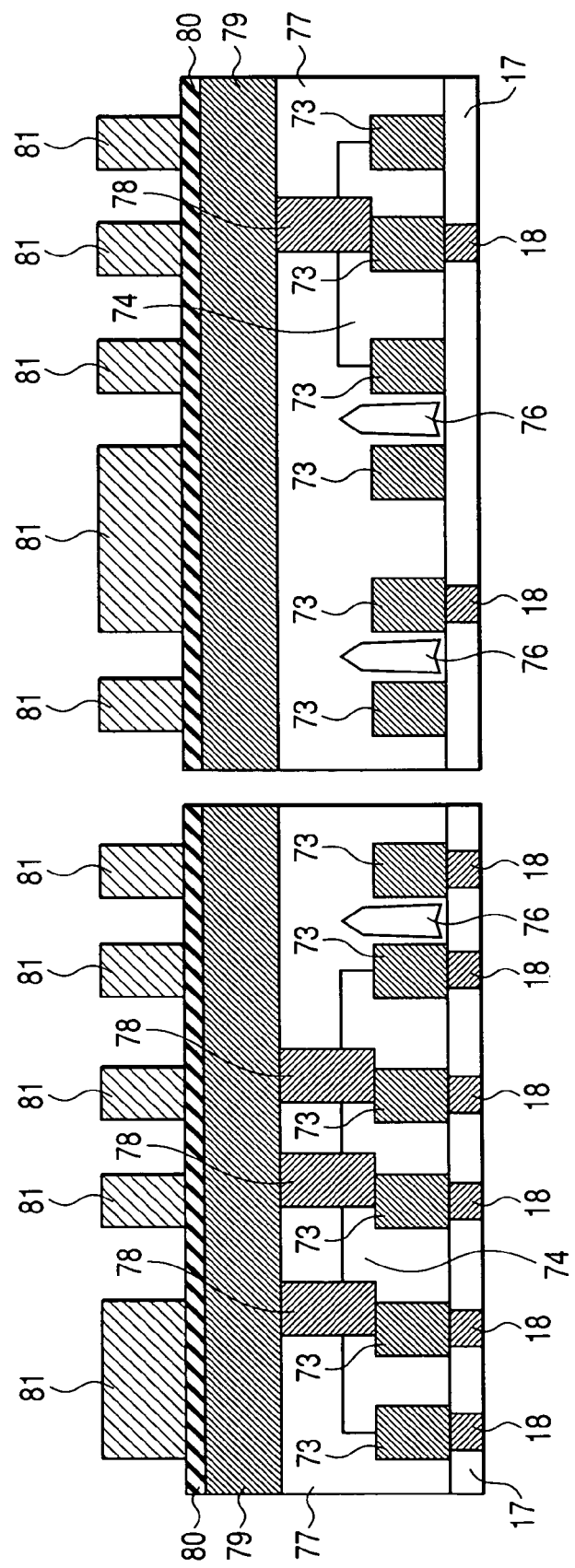
FIG. 38 is a cross sectional view for a main portion in the manufacturing step of a semiconductor device succeeding to FIG. 37.

As shown in FIG. 37, a via hole 78 is formed in the insulative film 77. In this case, since the reservoir formed previously is present in the narrow portion between adjacent interconnections where the via hole is formed, misalignment, if should occur, results in no problem and favorable contact can be formed.

FIG. 38 to FIG. 41 show a method of preparing a third layer interconnection. At first, as shown in 38, a conductive film 79 is formed, and an anti-reflective film 80 and a photoresist film are formed successively above the conductive film 79, and the photoresist film is patterned by exposure to form a photoresist pattern 81. The conductive film 79 is not restricted only to aluminum but may be changed variously. For example, it may be a single film of aluminum (Al), aluminum alloy, etc., a laminate metal film in which a metal film of titanium (Ti) or titanium nitride (TiN) is formed on at least one of upper and lower layers of the single film, or it may be a tungsten film or the like.

Figure 39:
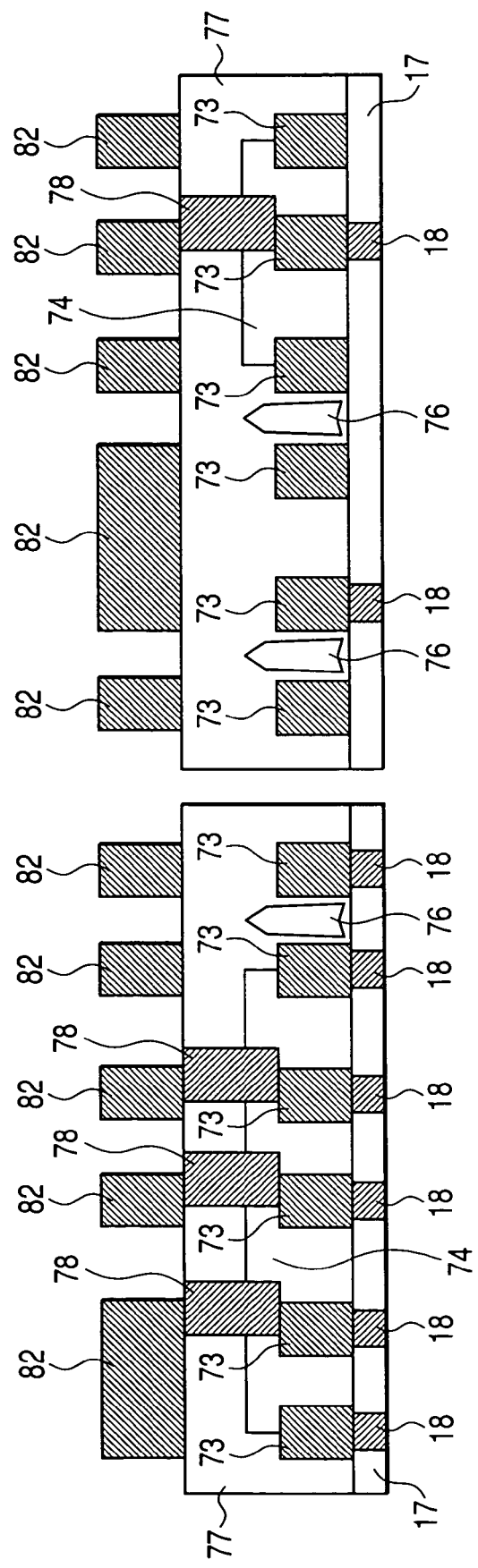
FIG. 39 is a cross sectional view for a main portion in the manufacturing step of a semiconductor device succeeding to FIG. 38.
Figure 40:
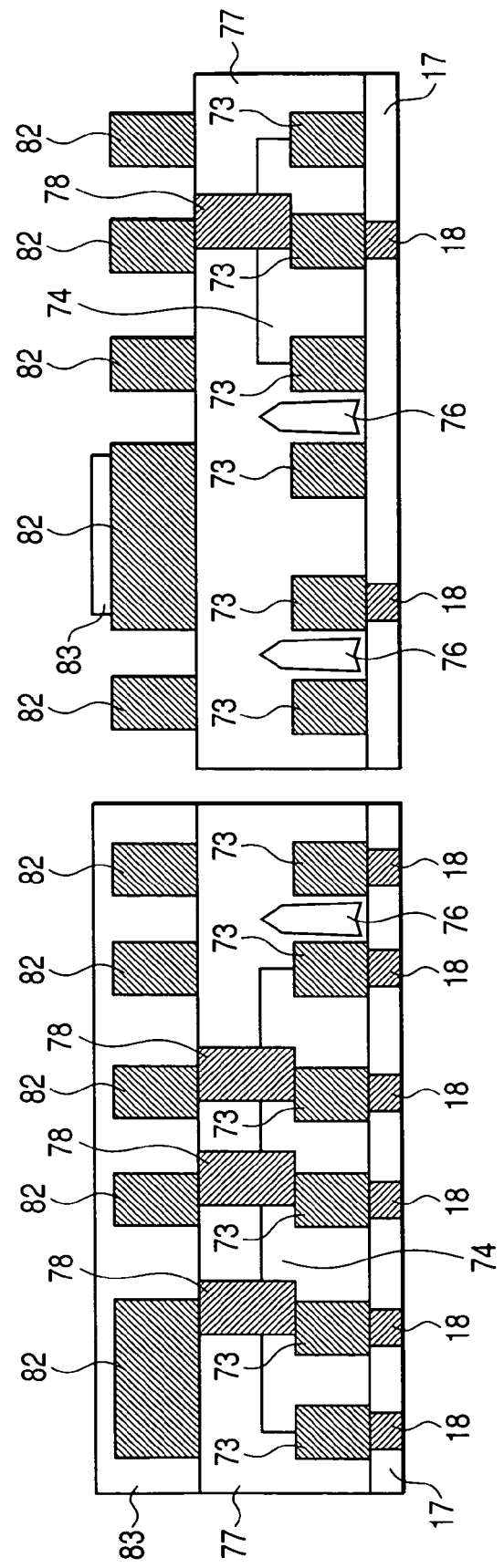
FIG. 40 is a cross sectional view for a main portion in the manufacturing step of a semiconductor device succeeding to FIG. 39.
Figure 41:
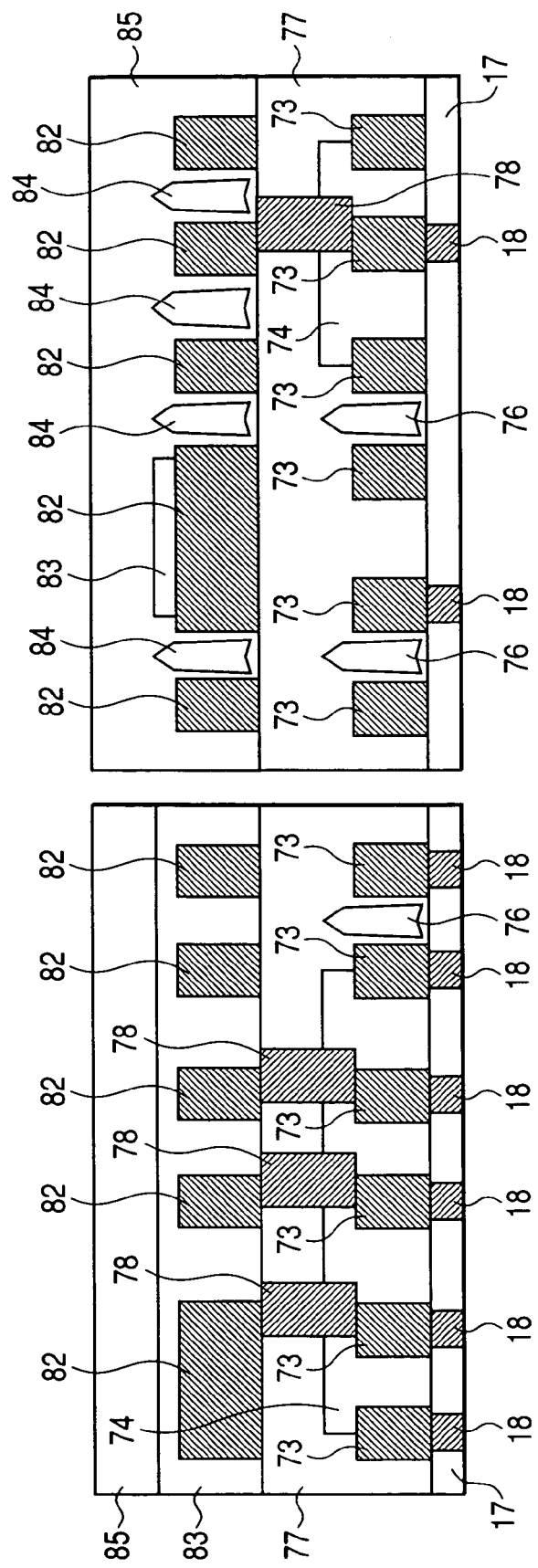
FIG. 41 is a cross sectional view for a main portion in the manufacturing step of a semiconductor device succeeding to FIG. 40.

Then, as shown in FIG. 39, the anti-reflective film 80 and the conductive film 79 are selectively removed by a dry etching method using the photoresist pattern 81 as an etching mask to form a third interconnection layer 82. Then, the method of forming the reservoir and the air gap described for FIG. 34 to FIG. 36 is used in the same manner. At first, an insulative film 83 is optionally fabricated to form a reservoir between the third layer interconnection 82 as shown in FIG. 40. Then, as shown in FIG. 41, an insulative film 85 is formed above the insulative film 83 and an air gap 84 is formed. Finally, the upper portion of the insulative film 85 is planarized by interlayer insulative film CMP. Also for the upper layers, same air gap interconnections can be formed by the steps repeated so far.

Embodiment 4

Figure 42:
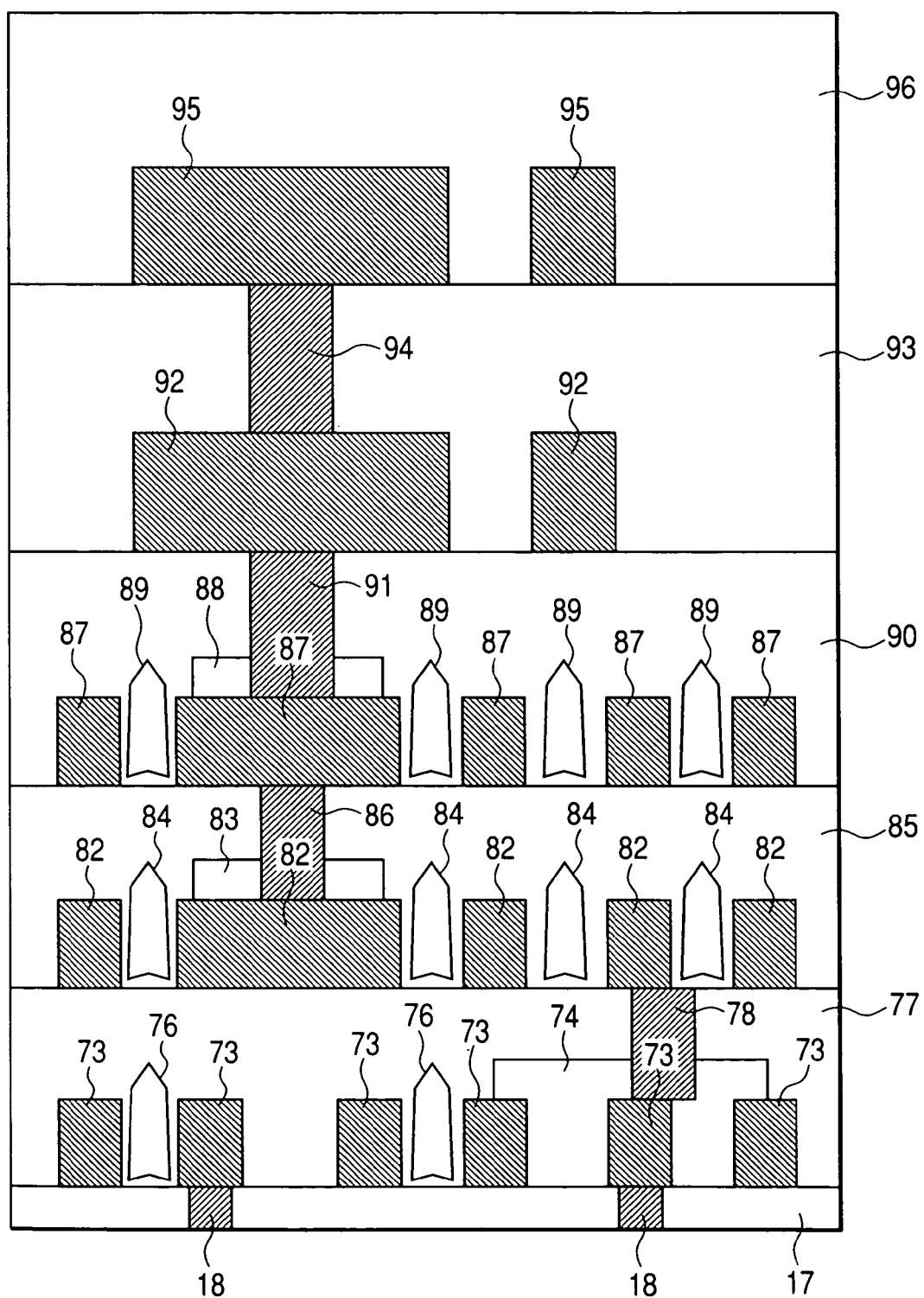
FIG. 42 is a cross sectional view for a main portion in the manufacturing step of a semiconductor device in another embodiment of the invention.

FIG. 42 is a cross sectional view for a main portion in the manufacturing step of a semiconductor device as other embodiment of the invention. The semiconductor device of this embodiment includes a multi-layered interconnection structure having, in combination, a structure in which a void is formed between adjacent interconnections and an insulative film structure for reservoir is present between adjacent interconnections in each of the interconnections layers, and an interconnection layer formed by using a general dry etching interconnection technique. In FIG. 42, since the steps up to the step of forming the insulative film 85 are substantially identical with the manufacturing steps up to FIG. 41 of the embodiment 3, descriptions therefor are omitted and only the subsequent manufacturing steps are to be described.

In this embodiment, a via hole 86 is formed in an insulative film 85, and a fourth layer interconnection 87 is formed above the insulative film 85 and the via hole 86 in the same manner as the third layer interconnection 82. Then, a reservoir is prepared by an insulative film 88, over which an insulative film 90 is formed and planarized. Also in the fourth layer interconnection 87, a void 89 is formed between the closest interconnections like in the second layer interconnection 73 and the third layer interconnection 82.

The fifth and succeeding interconnection layers are formed by using a general dry etching technique for the conductive film. At first, after forming a via hole 91 in the insulative film 90, a conductive film is formed. Then, a fifth layer interconnection 92 is formed by using a dry etching technique. Then an insulative film 93 is formed on the lateral surface and the upper surface of the fifth layer interconnection 92 and planarized. Subsequently, a via hole 94 is formed in the insulative film 93, and an conductive film is formed above the insulative film 93 and the conductive film 94. Then, a sixth layer interconnection 95 is formed by using a dry etching technique and after forming an insulative 96, planarization is conducted.

For the insulative films 74, 77, 83, 85, 88, 90, 93, and 96, a film formed by using a CVD method can be used including, for example, a silicon oxide film, an FSG (SiOF material) film, an SiOC film, or a porous silicon (Porous-Si) material film. When the FSG film, SiOC film or porous silicon film is used, an insulation film of a two-layered structure formed by capping a silicon oxide film thereon can also be used.

In the multi-layered interconnection structure, the capacitance between interconnections increases in an interconnection layer with a relatively small distance between adjacent interconnections, that is, with relatively small interconnection pitch. According to this embodiment, the capacitance between such interconnections can be decreased by forming an air gap while favorably keeping the contact of misaligned via hole in such interconnection layer in which the capacitance between the interconnections tends to be increased.

What is claimed is:

1. A method of manufacturing a semiconductor device including the following steps of:
   (a) forming a plurality of interconnection trenches in a first insulative film above a semiconductor substrate;
   (b) forming a first conductor film above the first insulative film including the inside of each of the plurality of the interconnection trenches;
   (c) removing the first conductor film outside of the plurality of the interconnection trenches by a CMP method thereby forming an interconnection comprising the first conductor film in the inside of each of the plurality of the interconnection trenches;
   (d) forming a first barrier insulative film above the first insulative film and the plurality of the interconnections;
   (e) leaving the first barrier insulative film and the first insulative film in a peripheral region of a through hole formed in a step (h), where an interconnection interval is narrow in the peripheral region, and removing the first barrier insulative film and the first insulative film in a region other than the peripheral region;
   (f) forming a second barrier insulative film above the first barrier insulative film and on the lateral surface and above the upper surface of the interconnection;
   (g) forming a second insulative film above the second barrier insulative film while leaving an air gap in the space region between the interconnections from which the first barrier insulative film and the first insulative film have been removed;
   (h) forming the through hole that penetrates the first barrier insulative film, the second barrier insulative film and the second insulative film above the interconnection and exposes an upper surface of the interconnection; and
   (i) forming a second conductor film to the inside of the through hole.

2. A manufacturing method of a semiconductor device according to claim 1, wherein the first conductor film is formed, after depositing a first conductive barrier film above the first insulative film, by depositing a main conductor film comprising copper above the conductive barrier film.

3. A manufacturing method of a semiconductor device according to claim 2, wherein the first conductive barrier film comprises a high melting metal nitride film, a high melting metal film, or a laminate film thereof.

4. A manufacturing method of a semiconductor device according to claim 2, wherein the second conductor film is formed, after depositing a second conductive barrier layer to the inside of the through hole, by depositing a main conductor film comprising copper above the second conductive barrier film.

5. A manufacturing method of a semiconductor device according to claim 4, wherein the second conductive barrier film comprises a high melting metal nitride film, a high melting metal film, or a laminate film thereof.

6. A manufacturing method of a semiconductor device according to claim 1, wherein the second insulative film comprises an SiOF film or an SiOC film.

7. A manufacturing method of a semiconductor device according to claim 1, wherein the first insulative film is a laminate film of a lower layer film comprising a silicon nitride film, a silicon carbide film, a silicon carbonitride film, or a silicon oxynitride film, an intermediate film comprising an SiOF film or an SiOC film, and an upper layer film comprising a silicon oxide film.

8. A manufacturing method of a semiconductor device according to claim 1, wherein the first and the second barrier insulative films comprise a silicon nitride film, a silicon carbide film, a silicon carbonitride film, or a silicon oxynitride film.

9. A manufacturing method of a semiconductor device according to claim 2, wherein a photoresist pattern is formed above the first barrier insulative film in the region below the through hole and the peripheral region thereof in the step (e), and the first barrier insulative film and the first insulative film are removed by a dry etching method using the photoresist pattern as a mask.

10. A manufacturing method of a semiconductor device according to claim 2, wherein the step (a) includes forming a third insulative film above the first barrier insulative film, then forming a photoresist pattern covering the region for forming the through hole and the peripheral region thereof, etching the third insulative film by using the photoresist pattern as a mask, removing the photoresist pattern, and then removing the first insulative film by a dry etching method using the etched third insulative film as a mask.

11. A manufacturing method of a semiconductor device according to claim 10, wherein the third insulative film is a silicon oxide film or an SiOC film.

* * * * *